US006323740B1

(12) United States Patent
Ishikawa et al.

(10) Patent No.: US 6,323,740 B1
(45) Date of Patent: Nov. 27, 2001

(54) HIGH-FREQUENCY CIRCUIT DEVICE AND COMMUNICATION APPARATUS

(75) Inventors: Yohei Ishikawa, Kyoto; Kenichi Iio, Nagaokakyo; Takatoshi Kato, Mino; Koichi Sakamoto, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/356,394

(22) Filed: Jul. 16, 1999

(30) Foreign Application Priority Data

Jul. 24, 1998 (JP) ........................................ 10-209520
Feb. 3, 1999 (JP) ........................................ 11-025873

(51) Int. Cl.[7] ........................ H01P 1/16; H03H 9/00
(52) U.S. Cl. .................. 333/21 R; 333/143; 333/151; 333/251
(58) Field of Search ....................... 333/1, 21 R, 143, 333/151, 246, 251

(56) References Cited

U.S. PATENT DOCUMENTS 6,023,209 * 2/2000 Faulkner et al. .................... 333/238

* cited by examiner

*Primary Examiner*—Robert Pascal
*Assistant Examiner*—Kimberly E Glenn
(74) *Attorney, Agent, or Firm*—Ostrolenk, Faber, Gerb & Soffen, LLP

(57) ABSTRACT

Electrodes are formed on both top and bottom surfaces of a dielectric plate and grounded coplanar lines, as transmission lines, are formed on the top surface of the dielectric plate. A plurality of micro-strip lines, each composed of high-impedance lines and low-impedance lines alternately connected in series, is arranged at a pitch shorter than the wavelength of a wave traveling along the grounded coplanar lines. A spurious mode propagation blocking circuit thus constructed prevents a spurious mode wave, such as a parallel-plate mode, from traveling.

37 Claims, 32 Drawing Sheets

HIGH-FREQUENCY CIRCUIT DEVICE AND COMMUNICATION APPARATUS

BACKGROUND OF THE INVENTION

1. Field of the Invention

The present invention relates to a high-frequency circuit device such as a wave guide or a resonator, having two parallel planar conductors, and a communication apparatus employing such a high-frequency circuit device.

2. Description of the Related Art

A variety of transmission lines may be employed in apparatuses operating in the micro-wave band and the millimeter-wave band. The following transmission lines are typically available: (i) a grounded coplanar line composed of a dielectric plate with one side generally coated with a ground electrode and the other side having a coplanar line thereon; (ii) a grounded slot line composed of a dielectric plate with one side coated with a ground electrode and the other side having a slot; and (iii) a planar dielectric line composed of a dielectric plate with both sides having slots.

Each of the above transmission lines usually have two parallel planar conductors. When an electromagnetic field is disturbed by input and output sections and bend sections of the transmission line, a spurious mode wave (also simply referred to as a "spurious mode"), such as a parallel-plate mode wave, is induced and travels between the two parallel planar conductors. For this reason, the leaky spurious mode waves interfere with each other between adjacent lines, presenting the problem of leakage signals.

FIG. 38 illustrates the main transmission mode of a grounded coplanar line and the distribution of a parallel-plate mode electromagnetic field which is generated along with it. As shown, the underside of a dielectric plate 20 is generally coated with an electrode 21 and the top surface of the dielectric plate 20 has a strip conductor 19 and an electrode 22. The electrodes 21 and 22 serve as ground electrodes, and the grounded coplanar line is thus composed of electrodes 21 and 22, the dielectric plate 20 and the strip conductor 19. In such a grounded coplanar line, the electromagnetic field may be disturbed at its edges such that an electric field is established in a direction perpendicular to the electrodes 21 and 22, and a parallel-plate mode electromagnetic field occurs as shown. Solid lines with arrow heads represent the electric field, broken lines represent the magnetic field, and two-dot chain lines represent the distribution of currents.

To control the propagation of such an unwanted mode wave, through holes are conventionally provided along both sides of a transmission line at a pitch shorter than the wavelength of a transmission mode wave, thereby connecting top and bottom electrodes arranged on the top and bottom faces of a dielectric plate.

The through holes, arranged along the direction of propagation for connecting the top and bottom electrodes, serves as a wall (hereinafter referred to as "electric barrier"), blocking the propagation of the parallel-plate mode wave. However, in a high frequency region, such as the millimeter-wave band, the dielectric plate must be thin to control the generation of harmonic mode waves, and the intervals between the through holes must be extremely short. This involves high processing accuracy in the manufacture of the circuit device.

When no through holes are arranged in the dielectric plate, the dielectric plate having electrodes thereon are entirely housed in a cutoff wave guide. In such a case, however, the dimensions of the cutoff wave guide must be equal to or smaller than half the guide wavelength, and the dimensional requirements of the wave guide become severer.

A portion of the electrode where the spurious mode wave leaks can be partially cut away to form a wall (hereinafter referred to as a "magnetic wall") to block the propagation of the spurious mode wave. This arrangement poses a new problem because the cutout portion of the electrode functions somewhat as a resonator.

SUMMARY OF THE INVENTION

Accordingly, it is an object of the present invention to provide a high-frequency circuit device which blocks the propagation of the spurious mode waves such as parallel-plate mode waves, while being free from the above-described problem associated with the electric wall of through holes and the magnetic wall of the cutout portion of an electrode.

When the electromagnetic field is disturbed on a strip conductor and electrodes are arranged on both sides of the strip conductor in a grounded coplanar line, spurious mode electromagnetic waves, such as a parallel mode wave, travel between the two parallel electrodes and reach the boundary of an electrode pattern. Since the configuration of the transmission line changes beyond the boundary, a portion of the electromagnetic wave is reflected from the boundary. The electromagnetic wave is disturbed at the discontinuity section of the electrode pattern, as the transmission line, and is converted into a mode which is transmitted through the transmission line configuration. Thus, a mode conversion is performed. The present invention takes advantage of this operation. A circuit is arranged to reflect a mode into which the spurious mode such as the parallel-plate mode is converted, thereby blocking the propagation of the spurious mode waves beyond the circuit.

A high-frequency circuit device of the present invention includes at least two planar conductors and a circuit for exciting an electromagnetic wave between the two planar conductors. A spurious mode propagation blocking circuit including a conductor pattern which blocks the propagation of a spurious mode wave by being coupled with the spurious mode wave that travels between the two planar conductors is arranged in at least one of the two planar conductors. The spurious mode propagation blocking circuit is coupled with the spurious mode wave traveling between the two planar conductors, thereby blocking the propagation of the spurious mode waved. Since the spurious mode propagation blocking circuit is formed in the planar conductor by simply patterning the electrode, any problems, such as the ones associated with the formation of the through holes in the conventional art, are not presented.

The conductor pattern of the spurious mode propagation blocking circuit preferably includes a plurality of micro-strip lines spaced apart at a pitch shorter than the wavelength of the electromagnetic wave.

In the high-frequency circuit device of the present invention, the micro-strip line of the spurious mode propagation blocking circuit is preferably a serial connection in which a high-impedance line and a low-impedance line are alternately connected in series. The spurious mode, such the parallel-plate mode, is converted into another mode at the micro-strip line and the resulting signal at a predetermined frequency is reflected. The propagation of the spurious mode wave is thus blocked.

In the high-frequency circuit of the present invention, a plurality of micro-strip lines are preferably arranged with their terminals opened. The spurious mode wave is thus converted into a micro-strip mode wave, which is then reflected from the open terminal. The spurious mode wave is thus blocked.

The conductor pattern of the spurious mode propagation blocking circuit preferably includes a plurality of basic patterns which are arranged at a pitch shorter than the wavelength of the electromagnetic wave, with the line of one basic pattern being connected to the line of the adjacent basic pattern, and wherein the basic pattern includes a polygonal or circular electrode for creating a capacitance with the other planar conductor different from one planar conductor forming the basic patterns and a plurality of lines connected to the electrode. Even when the spurious mode waves are reflected in a multiple fashion, the circuit device blocks the spurious mode waves, not only in a direction perpendicular to the direction of propagation of the spurious mode wave but also in a direction parallel to or in an acute (or obtuse) direction with respect to the direction of propagation of the spurious mode.

Preferably, the electrode which creates a capacitance with the other planar conductor different from the one planar conductor forming the basic patterns, is arranged at a junction position of the adjacent basic patterns. By choosing a proper circuit constant, a large blocking capability is provided in the blocking of the spurious mode wave.

Preferably, from among a plurality of lines connected to the electrode, no two lines are aligned in a line with each other in orientation or in junction position. In this way, the signal from one line (port) is equally distributed among other lines (ports), thereby increasing the transmission loss between two ports.

Preferably, the conductor pattern of the spurious mode propagation blocking circuit includes a plurality of basic patterns, each pattern being a two-terminal pair circuit composed of three strip lines, one central line and two end lines, connected in series, and wherein the coupling between the end lines is set to be stronger than the coupling between the central line and each of the two end lines. The micro-strip mode wave, into which the spurious mode is converted, is preferably sufficiently reflected (even when a low-dielectric-constant dielectric plate having an impedance which does not change greatly with the line width of the strip line varying, or a thick dielectric plate is used).

Preferably, the circuit for exciting the electromagnetic wave is a transmission line, and the spurious mode propagation blocking circuit is arranged between the transmission line and another transmission line or a resonator. This arrangement prevents the interference of leaky waves between the adjacent transmission-lines, and the interference of leaky waves between the transmission line and the resonator.

Preferably, the transmission line is a grounded coplanar line, a grounded slot line, a strip line, a planar dielectric line, or a dielectric line.

The circuit for exciting the electromagnetic wave is preferably a resonator and the spurious mode propagation blocking circuit is preferably arranged on the periphery of the resonator. This arrangement prevents the interference of leaky waves between the resonator and the other transmission line and between one resonator and the other resonator.

The resonator may be of a type which has non-conductive cutout portions, formed on parallel planar conductors and serving as a magnetic wall. The electromagnetic wave is confined between the cutout non-conductive portions. Alternatively, the resonator may be of a type which has electric walls formed on parallel planar conductors and the electromagnetic wave is confined between the non-conductive cutout portions.

A communication apparatus preferably includes a high-frequency circuit device in a signal transmission section or in a signal processing section

DESCRIPTION OF THE PREFERRED EMBODIMENTS

The embodiments of a high-frequency circuit device of the present invention are now discussed, referring to FIG. 1A through FIG. 11B.

Figure 1A:
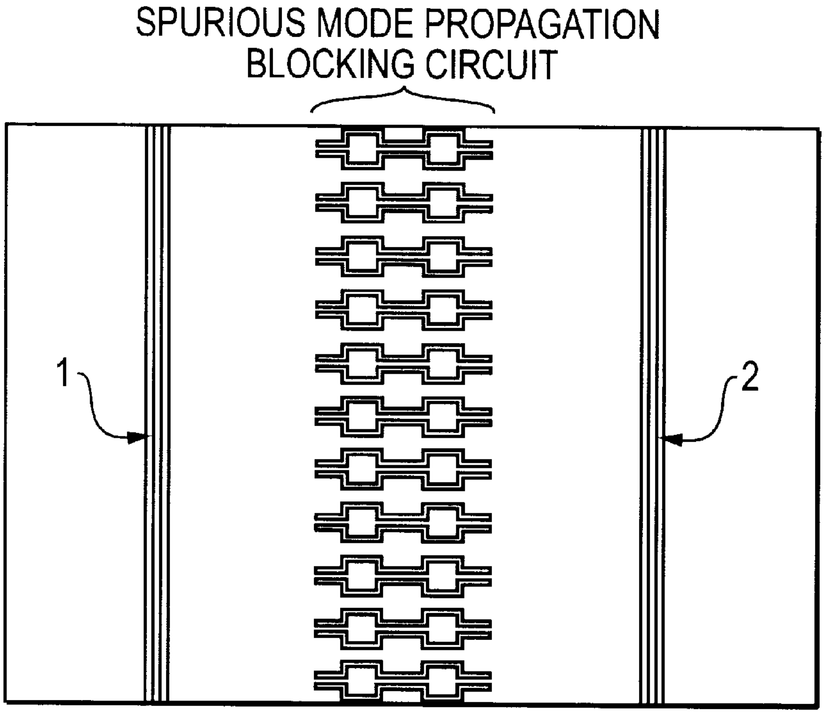
FIG. 1A is a top view showing a high-frequency circuit device of a first embodiment of the present invention.
Figure 1B:
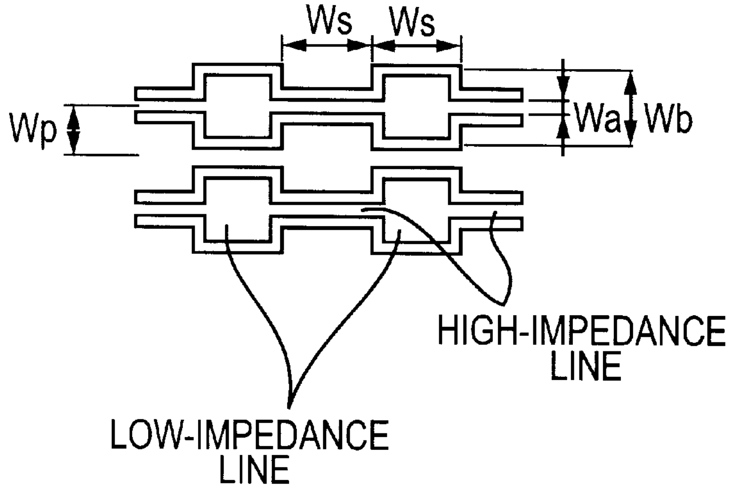
FIG. 1B is a cross-sectional view of the high-frequency circuit.

FIG. 1A is a top view showing a major portion of the high-frequency circuit device. Referring to FIG. 1A, coplanar lines 1 and 2 run parallel to each other on the top surface of a dielectric plate, and a spurious mode propagation blocking circuit 3, centrally running between the two lines 1 and 2, are formed by patterning an electrode on the top surface of the dielectric plate. FIG. 1B is an enlarged view showing a portion of the spurious mode propagation blocking circuit 3.

Figure 2:
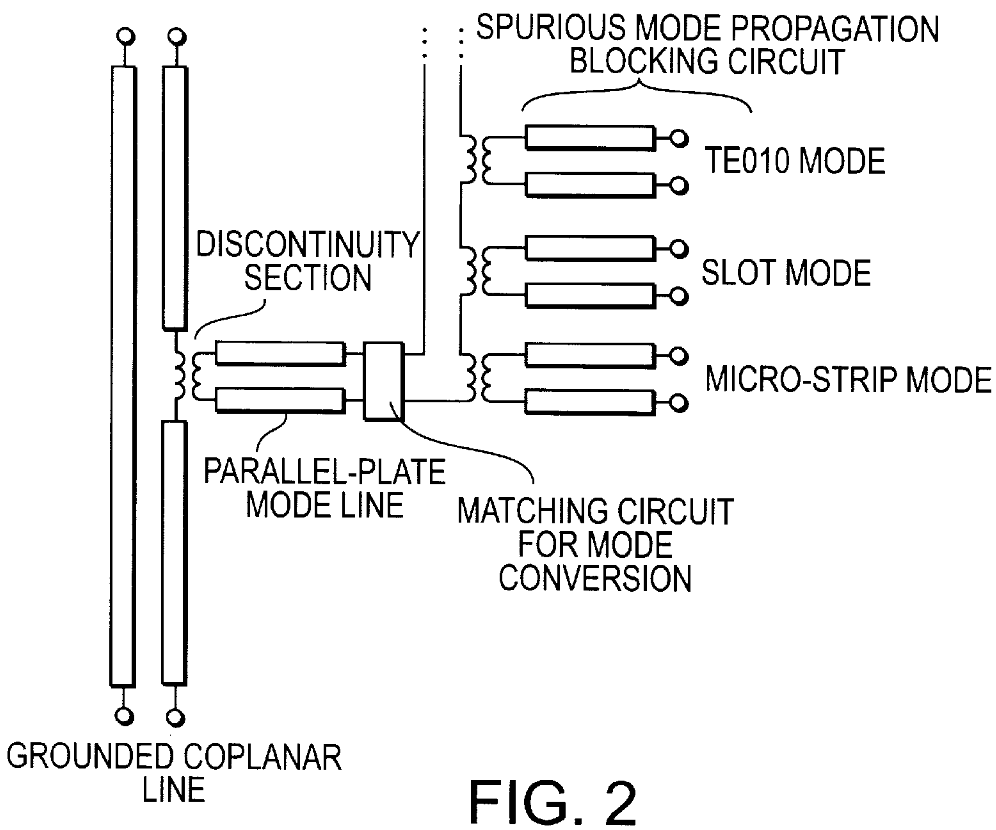
FIG. 2 is an equivalent circuit diagram of the high-frequency circuit of FIG. 1A having a transmission line and a spurious mode propagation blocking circuit.

In such a grounded coplanar line, a spurious mode wave, such as a parallel-plate mode wave, travels between top and bottom electrodes of the dielectric plate, and is then converted into a variety of modes by the spurious mode propagation blocking circuit 3 under a disturbance in the electromagnetic field between the central strip conductors and the electrodes on both sides. FIG. 2 is an equivalent circuit diagram of the grounded coplanar line. A parallel-plate mode wave is induced at a discontinuity section of the grounded coplanar line, and is then converted, by the spurious mode propagation blocking circuit 3, into a variety of modes including a TE010 mode, a slot mode and a micro-strip mode.

One of the mode waves traveling along the spurious mode propagation blocking circuit 3 is a quasi TEM mode of the micro strip. The amount of mode conversion at a boundary is discussed before discussing the mode conversion from the parallel-plate mode by the spurious mode propagation blocking circuit 3 shown in FIG. 1.

Figure 3:
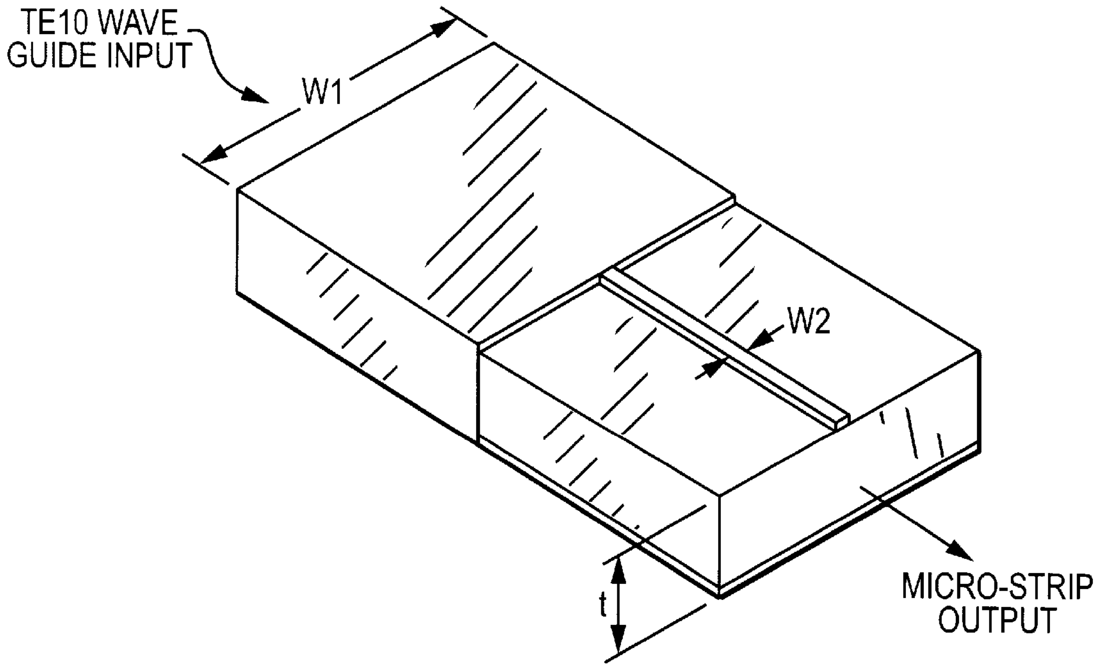
FIG. 3 is a perspective view showing a mode converting section between a wave guide mode and a micro-strip mode.

FIG. 3 is a perspective view showing the construction of a line converter, between a TE10 wave guide and a micro-strip line, to be used for calculation. Since the TE10 wave guide mode is equivalent to the parallel-plate mode in mode configuration, the TE10 mode wave guide is treated here as a transmission line of parallel-plate mode. Here, the width W1 of the wave guide is 3.4 mm (half the wavelength of the wave along the micro strip), the thickness t of the dielectric plate is 0.3 mm, the specific dielectric constant r of the dielectric plate is 3.2, the width W2 of the micro strip is 0.72 mm, and the characteristic impedance of the micro strip line is 50Ω.

Figure 4:
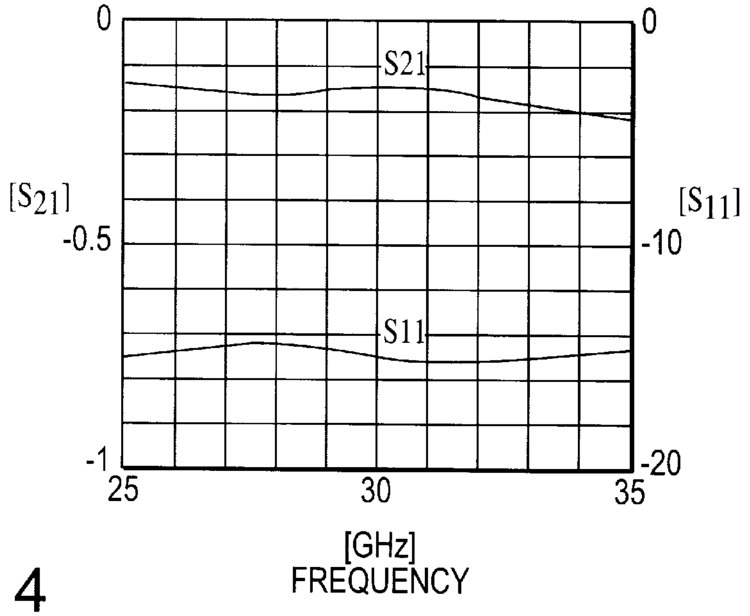
FIG. 4 shows characteristics of the mode converting section.

FIG. 4 shows an input reflection coefficient S11 and a forward transmission coefficient S21, versus frequency, of the line converter between the TE10 wave guide and the micro-strip line, determined using a three-dimensional electromagnetic field analysis simulator. At 0.30 GHz, as shown, the forward transmission coefficient S21 is −1.5 dB or lower, and the input reflection coefficient S11 is as low as −15 dB. An incident TE wave is mostly converted into the quasi TEM mode wave of the micro strip without being reflected.

Figure 5A:
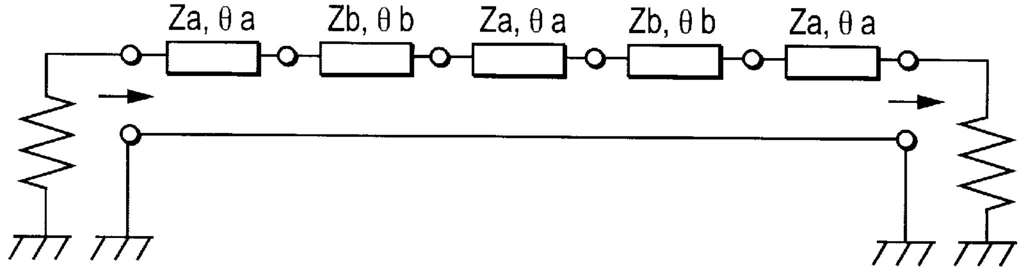
FIGS. 5A and 5B are equivalent circuit diagrams of the spurious mode propagation blocking circuit.
Figure 5B:
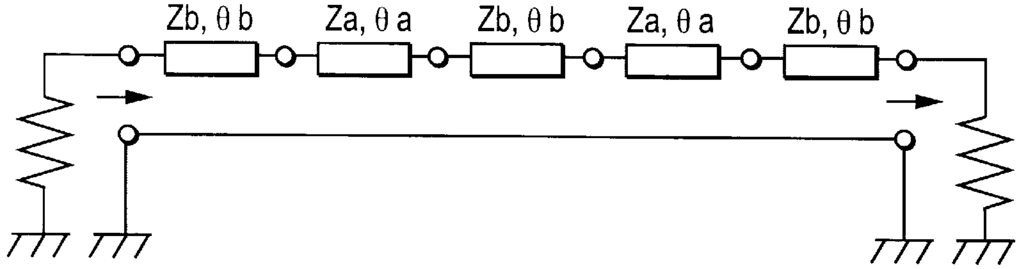

Since the quasi TEM mode wave in the micro strip has no cutoff frequency, it can be a transmission mode wave against any frequency. As shown in FIG. 1B, a pattern is created so that the wave is fully reflected at a desired frequency (here, 30 GHz). Referring to FIG. 1B, Wa=0.3 mm, Wb=1.5 mm, Ws=1.5 mm, and the thickness of the dielectric plate is 0.3 mm. The portion of the line having a line width Wb corresponds to a low-impedance line, and the portion of the line having a line width Wa corresponds to a high-impedance line. One micro-strip line of the spurious mode propagation blocking circuit 3 is equivalently a circuit composed of two different characteristic impedances alternately connected in series, each having its constant electrical length. FIGS. 5A and 5B show such equivalent circuits. FIG. 5A shows the equivalent circuit that starts with a high-impedance line and ends with a high-impedance line. FIG. 5B shows the equivalent circuit that starts with a low-impedance line and ends with a low-impedance line (here, Za>Zb). Referring to FIG. 1B, Ws is 1.5 mm, and is one-quarter of the wavelength along the micro-strip line (i.e., 30 GHz). Electrical lengths $\theta a$ and $\theta b$ in the equivalent circuit are respectively $\pi/2$.

Figure 6:
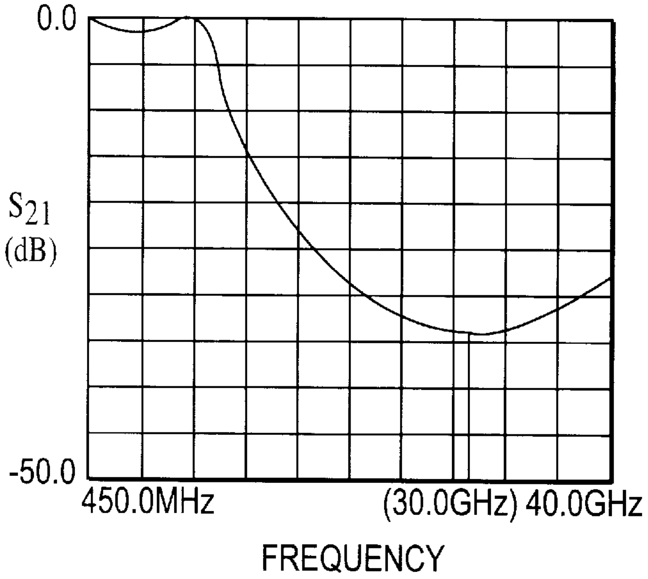
FIG. 6 is a characteristic diagram of the spurious mode propagation blocking circuit.

With each micro-strip line thus constructed, the signal having a desired frequency is fully reflected as shown in FIG. 6.

When a plurality of micro-strip lines are arranged, the pitch Wp of adjacent micro-strip lines is sufficiently shorter than the wavelength of the parallel-plate mode wave. In this embodiment, Wp=1.5 mm. For this reason, the parallel-plate mode does not leak out of the micro-strip lines.

Figure 7A:
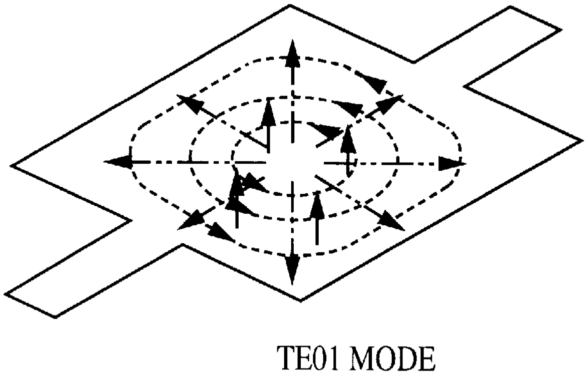
FIGS. 7A and 7B show modes in the spurious mode propagation block circuit.
Figure 7B:
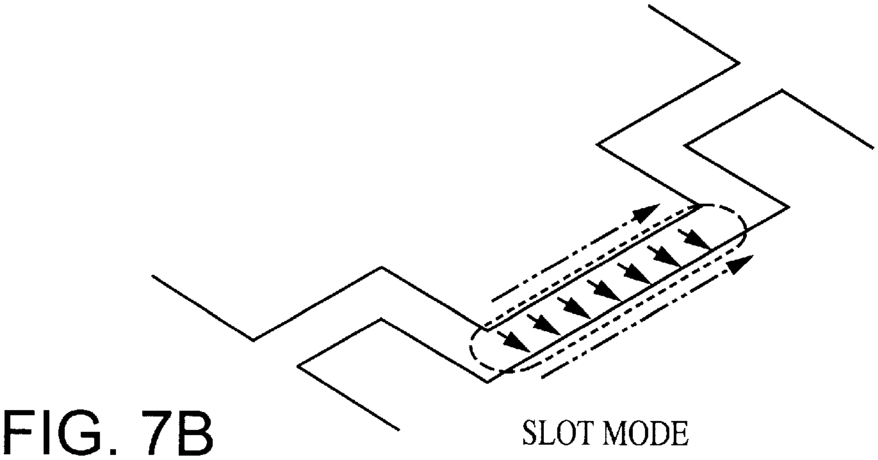

The spurious mode propagation blocking circuit 3 thus includes the micro-strip line composed of high-impedance lines and low-impedance lines, alternately connected in series, each having a constant electrical length. The spurious mode propagation blocking circuit 3 fully reflects the signal having a predetermined frequency. In the spurious mode propagation blocking circuit 3, a TE mode wave and a slot mode wave can be transmitted, besides the quasi TEM mode wave as the micro-strip mode wave. FIG. 7A shows a TE01 mode and FIG. 7B shows a slot mode.

The TE mode is now discussed. Referring to FIG. 7A, a solid line represents the electric field, a broken line represents the magnetic field, and a two-dot chain line represents the distribution of currents. In the TE mode configuration, the electric field is perpendicular to the parallel planar conductor while the magnetic field is looped parallel to the surface of an electrode.

Figure 8A:
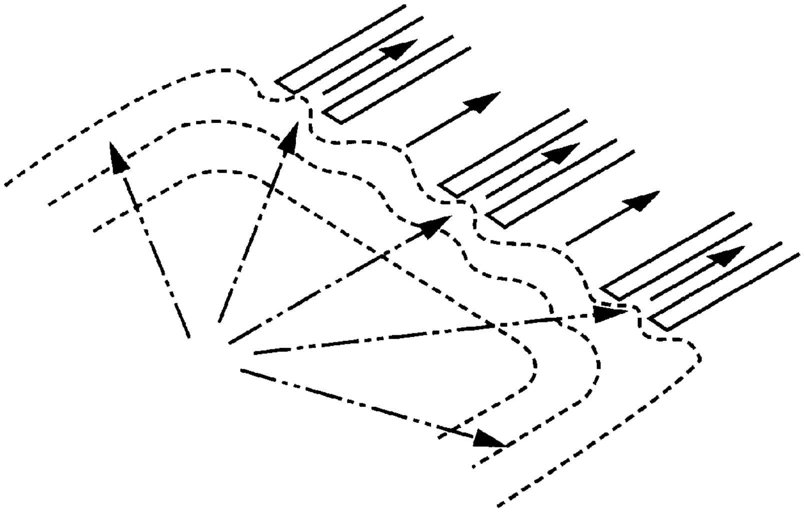
FIGS. 8A and 8B show how the spurious mode propagation blocking circuit is driven by a parallel-plate mode wave.
Figure 8B:
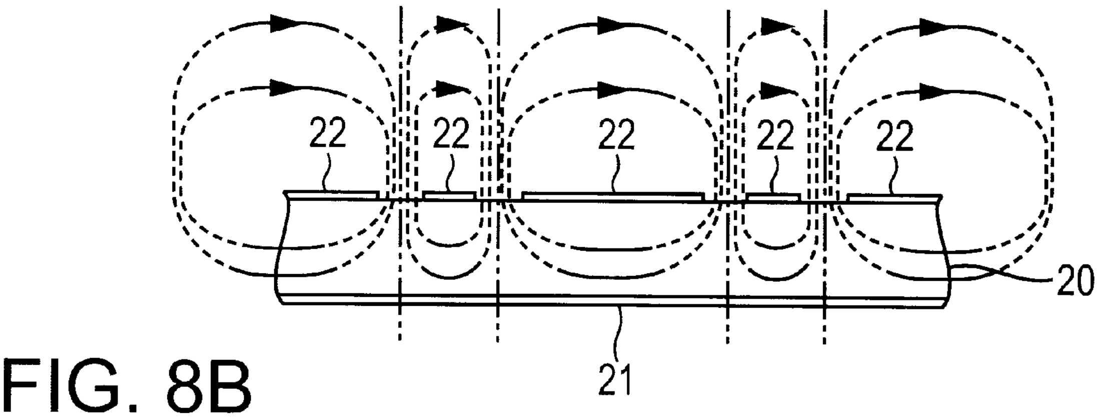

FIGS. 8A and 8B show the electromagnetic field on the boundary of the spurious mode propagation blocking circuit 3. FIG. 8A is a perspective view of the boundary, and FIG. 8B is a cross-sectional view of the boundary. As shown, the dotted line represents the magnetic field and the two-dot chain line represents the distribution of currents. Since adjacent lines, each having the high-impedance lines and the low-impedance lines, alternately connected in series, are driven by the same phase currents, a center surface between the two adjacent lines is considered to be an electric wall. The spurious mode propagation blocking circuit 3 is thus approximated to be a wave guide having a metal wall covering the boundary between the two adjacent lines. In this embodiment, there is a possibility that a square electrode, as large as 1.5 mm by 1.5 mm, functions as a TE110 mode resonator. The resonance frequency of the TE110 mode resonator is determined by calculation to be 79 GHz in this case. The cutoff frequency of the wave guide, rather than the resonator, is 58 GHz, and is sufficiently higher than the desired frequency (i.e., 30 GHz). The TE mode becomes therefore a non-transmission mode.

The propagation of the slot mode is now considered. Referring to FIG. 7B, the spurious mode propagation blocking circuit has a slot between two adjacent lines. Since a disturbance taking place on the boundary of the spurious mode propagation blocking circuit 3 excites two adjacent lines at the same phase, as shown in FIGS. 8A and 8B, no slot mode is generated, in principle.

The electromagnetic wave modes transmitting the spurious mode propagation blocking circuit are only the quasi TEM mode of the micro-strip line. If a pattern is designed to fully reflect this mode, the propagation of the parallel-plate mode is thus prevented.

Figure 9A:
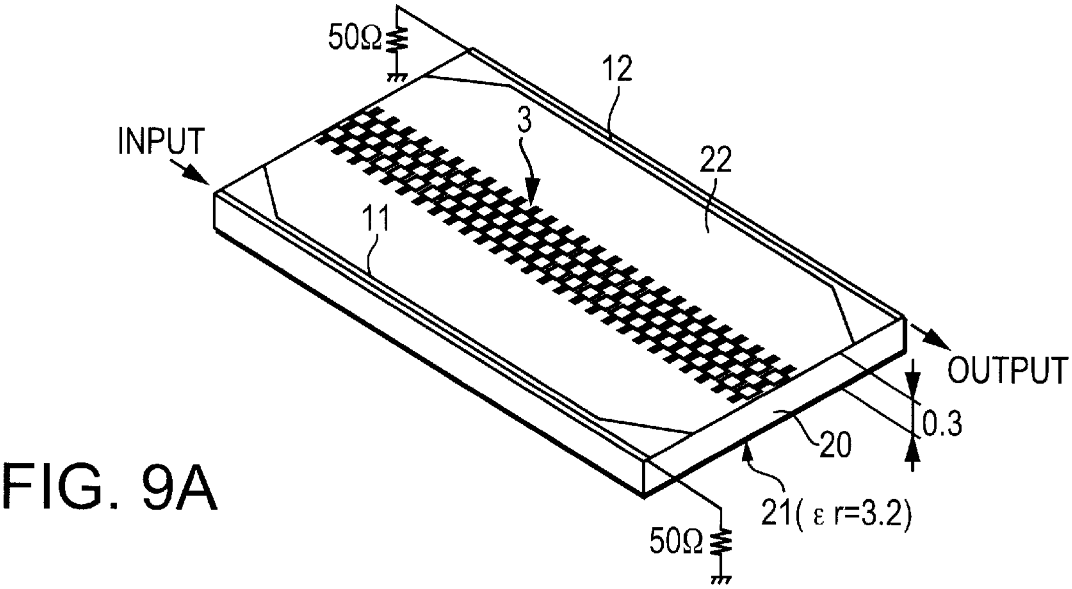
FIGS. 9A and 9B are perspective views of an evaluation device of the spurious mode propagation blocking circuit.
Figure 9B:
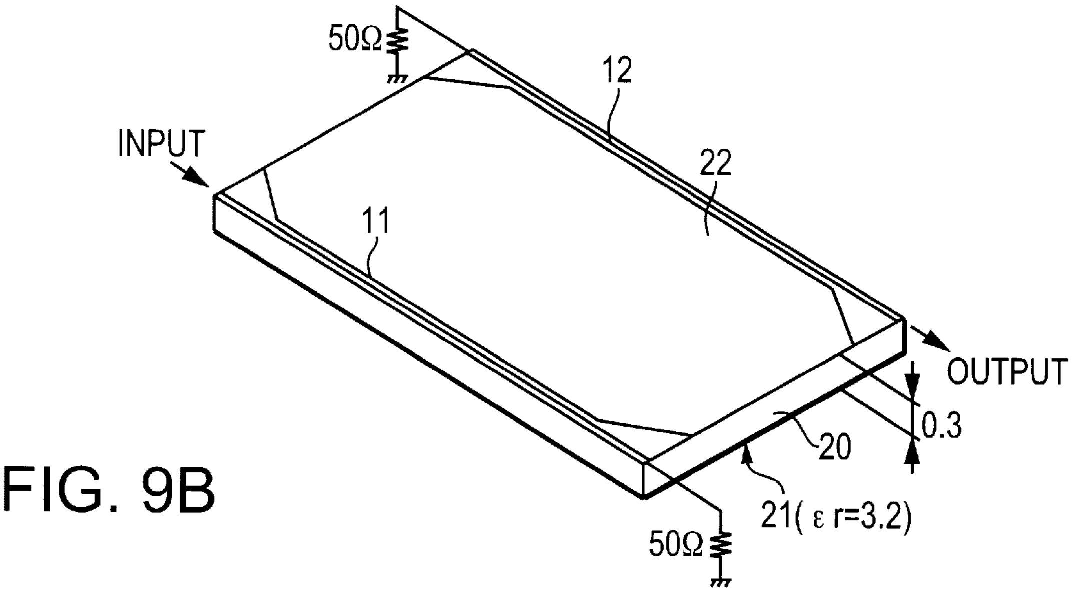
Figure 10:
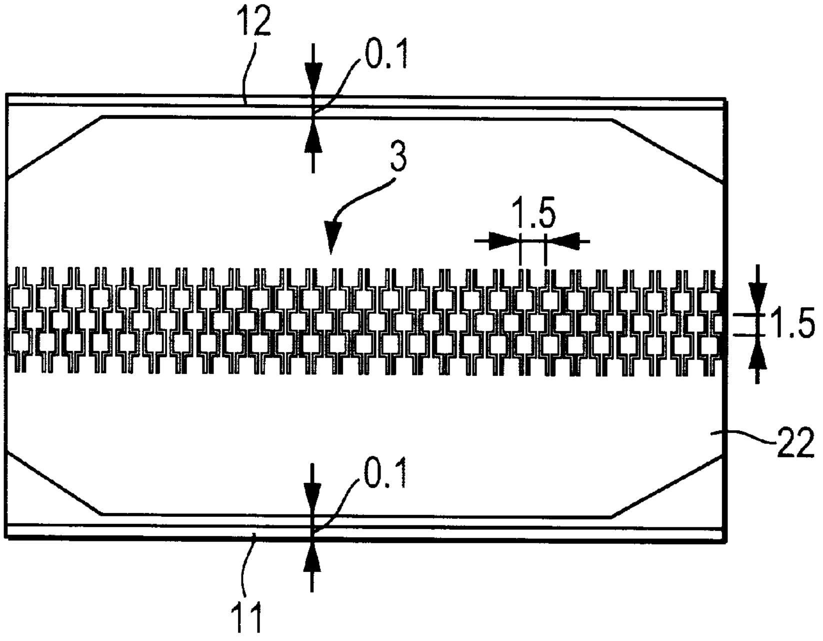
FIG. 10 is a top view of the circuit of the evaluation device.

Evaluation circuit patterns are shown in FIG. 9A through FIG. 10. FIG. 9A shows an evaluation circuit having a spurious mode propagation blocking circuit formed thereon and FIG. 9B shows an evaluation circuit having no spurious mode propagation blocking circuit. FIG. 10 is a top view of the evaluation circuit shown in FIG. 9A. Referring to FIG. 9A, a grounded coplanar line includes micro-strip lines 11 and 12, respectively, as input and output lines, an electrode 22 formed alongside them, and an electrode 21 formed on the underside of a dielectric plate 20. Unlike a regular grounded coplanar line, one side portion of the electrode is removed to destroy bilateral symmetry and to promote the generation of the parallel-plate mode wave. The output and input patterns have identical configurations to pick up the parallel-plate mode. This is based on the reciprocity theorem derived from Green's theorem, applied to the circuit.

Referring to FIG. 10, the separation between each of the micro-strip conductors 11 and 12 and the electrode 22 is as short as 0.1 mm. This electrode pattern disturbs the electromagnetic field in the maim transmission mode (i.e., TEM mode) traveling along the path, thereby converting it into a parallel-plate mode wave. The parallel-plate mode wave thus travels between the top and bottom electrodes 21 and 22 of the dielectric plate. This works in the same manner as the propagation of a radiation mode wave in a leaky wave antenna.

Figure 11A:
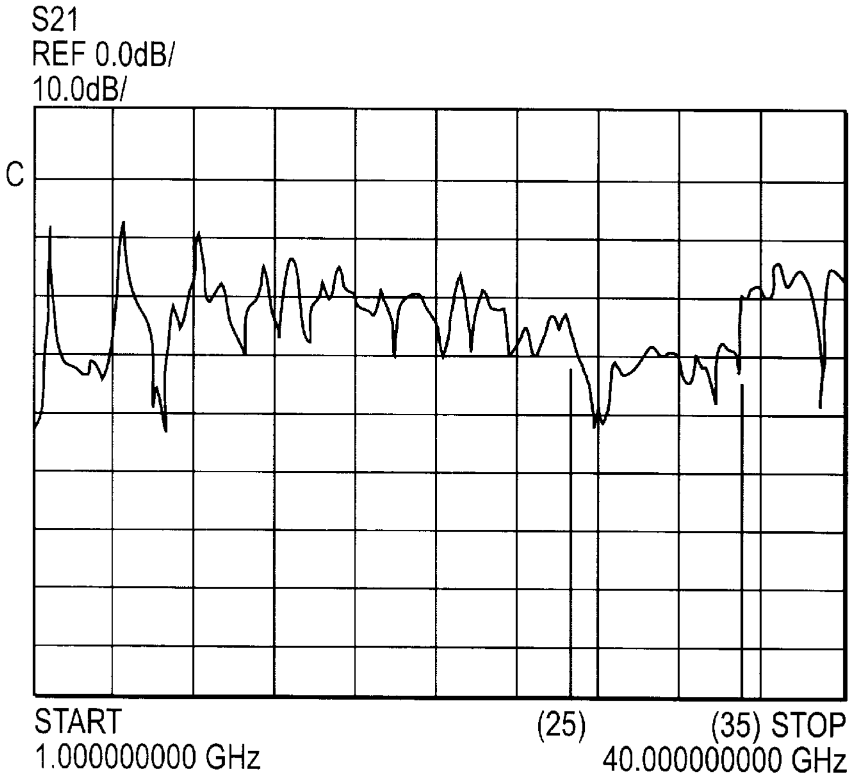
FIGS. 11A and 11B are characteristic diagrams of the circuit of the evaluation device shown in FIGS. 9A and 9B.
Figure 11B:
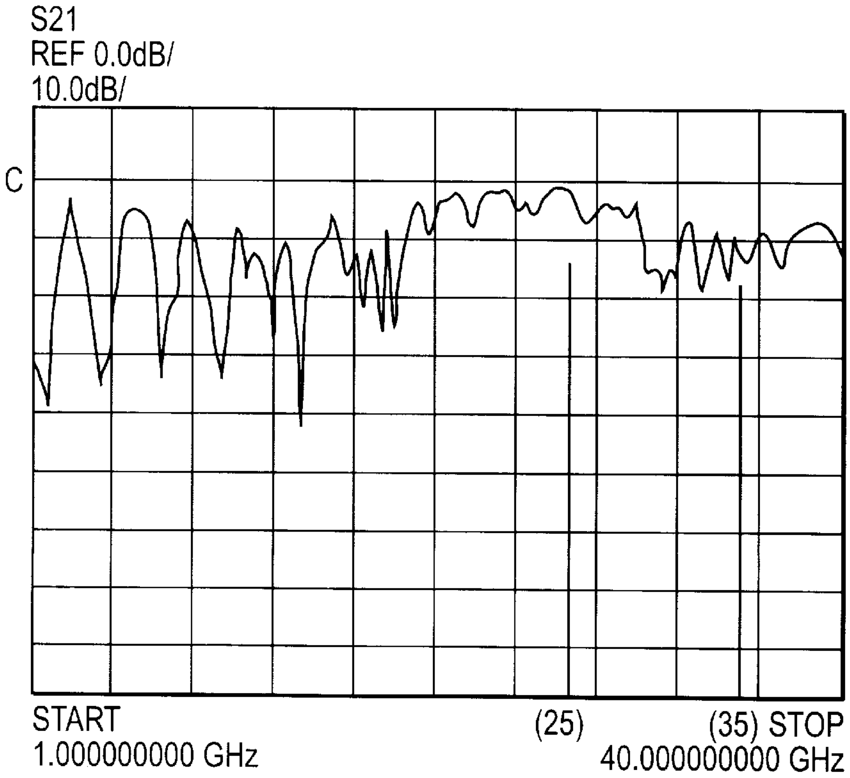

FIGS. 11A and 11B show the forward transmission coefficients S21 of the two evaluation circuits, respectively shown in FIGS. 9A and 9B. Without the spurious mode propagation blocking circuit 3, the parallel-plate mode wave travels at a level of −2 to −3 dB or higher in a range of 25 to 35 GHz. In contrast, the evaluation circuit with the spurious mode propagation blocking circuit 3 attenuates the parallel-plate mode wave to a level of −30 dB or lower in a range of 25 to 35 GHz.

Referring to FIG. 12A through FIG. 16B, specific examples of high-frequency circuit devices are discussed.

Figure 12A:
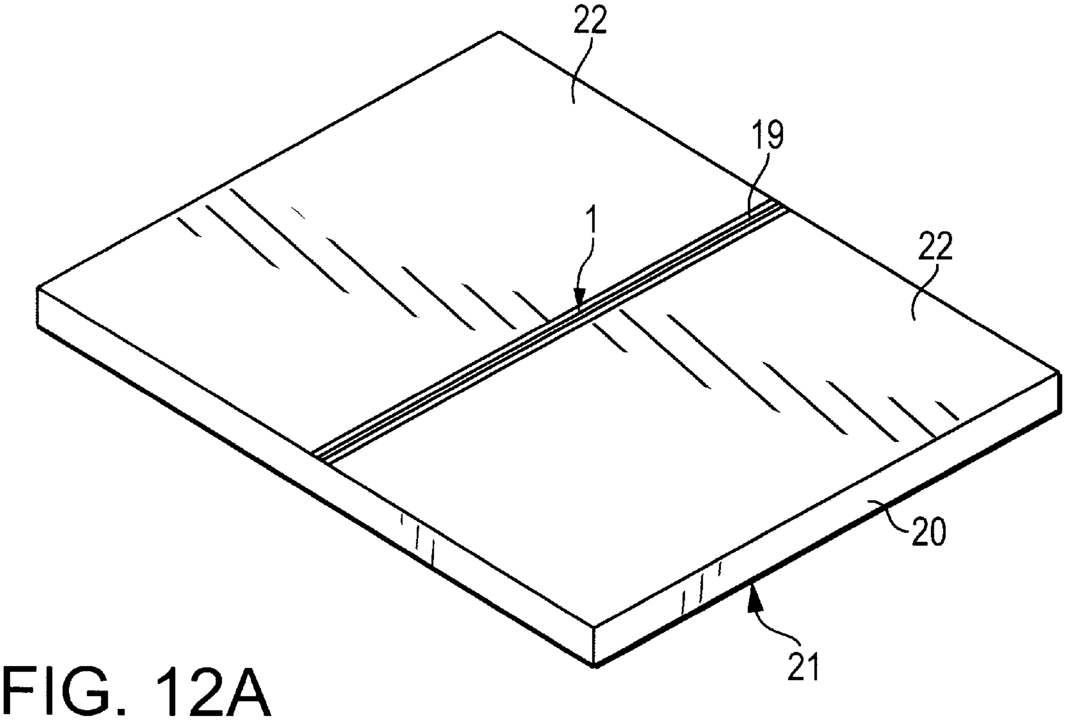
FIGS. 12A and 12B show a grounded coplanar line associated with a spurious mode propagation blocking circuit.
Figure 12B:
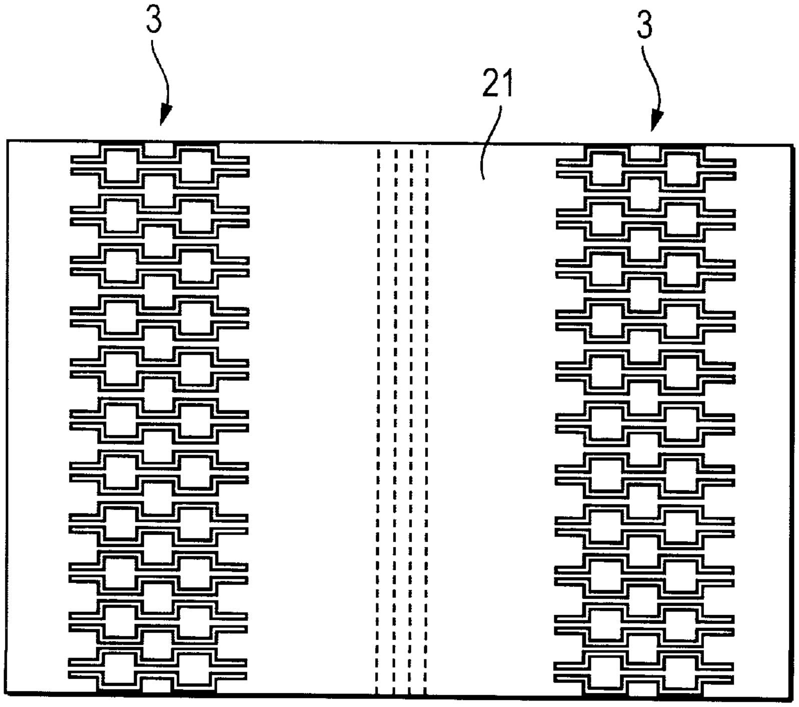

FIG. 12A is a perspective view of one example of a high-frequency circuit device and FIG. 12B is an enlarged underside view of the same high-frequency circuit device. As shown, an electrode 21 is formed on the bottom surface of a dielectric plate 20, and an electrode 22 and a strip conductor 19 are formed on the top surface of the dielectric plate 20. The strip conductor 19 partly functions as a grounded coplanar line 1. By patterning the electrode 21 on the underside of the dielectric plate 20, the spurious mode propagation blocking circuits 3 are formed on both sides of the grounded coplanar line 1. The spurious mode propagation blocking circuit 3 may be formed not only on the surface of the strip conductor 19 but also on the underside of the dielectric plate 20, and the parallel-plate mode wave traveling between the electrodes 21 and 22 is converted into the quasi TEM mode of the micro strip of the spurious mode propagation blocking circuit 3, and is then fully reflected. In this way, almost no parallel-plate mode travels beyond the spurious mode propagation blocking circuit 3.

Figure 13:
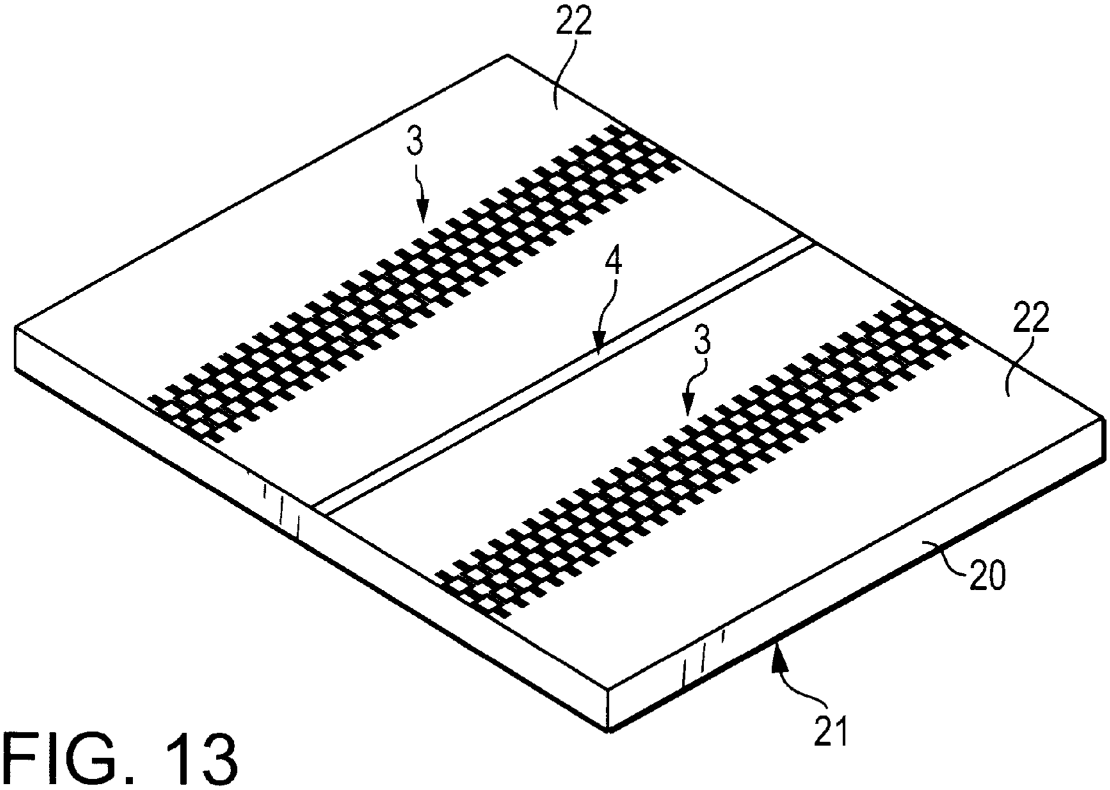
FIG. 13 shows a grounded slot line associated with a spurious mode propagation blocking circuit.

In a high-frequency circuit device shown in FIG. 13, an electrode 21 is formed on the entire bottom surface of a dielectric plate 20. Electrodes 22 are formed on the top surface of the dielectric plate 20. A slot is arranged in a predetermined position, forming a grounded slot line 4. By patterning the electrodes 22, spurious mode propagation blocking circuits 3 are formed on both sides of the slot.

Figure 14A:
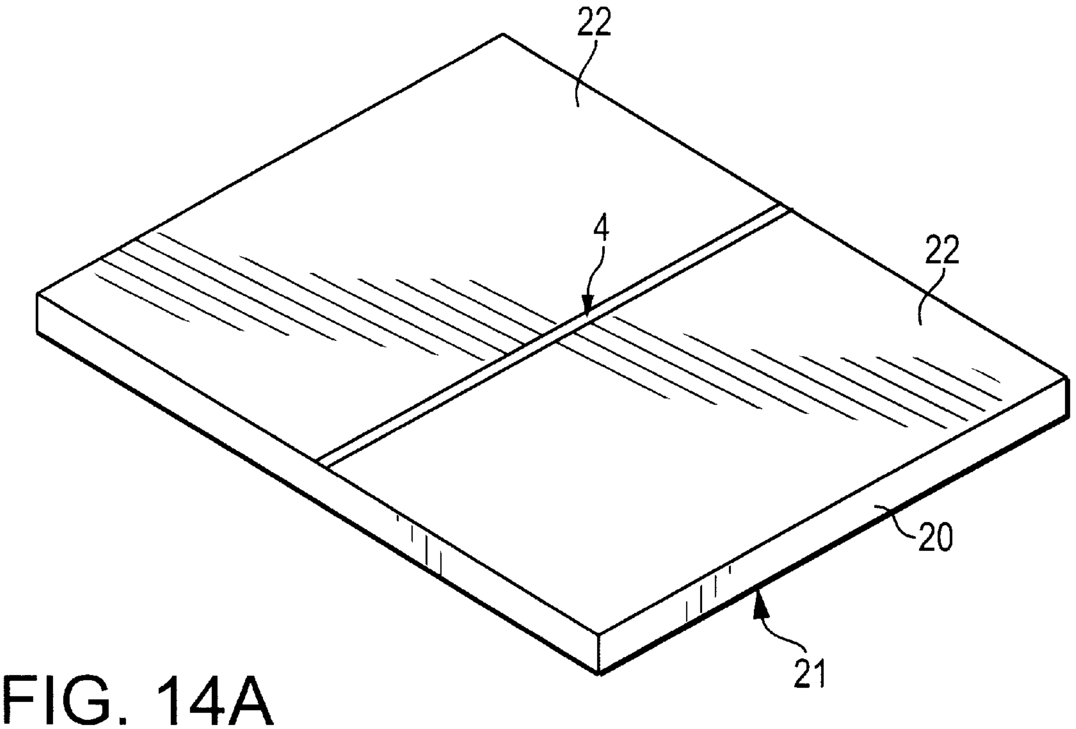
FIGS. 14A and 14B show another grounded slot line associated with a spurious mode propagation blocking circuit.
Figure 14B:
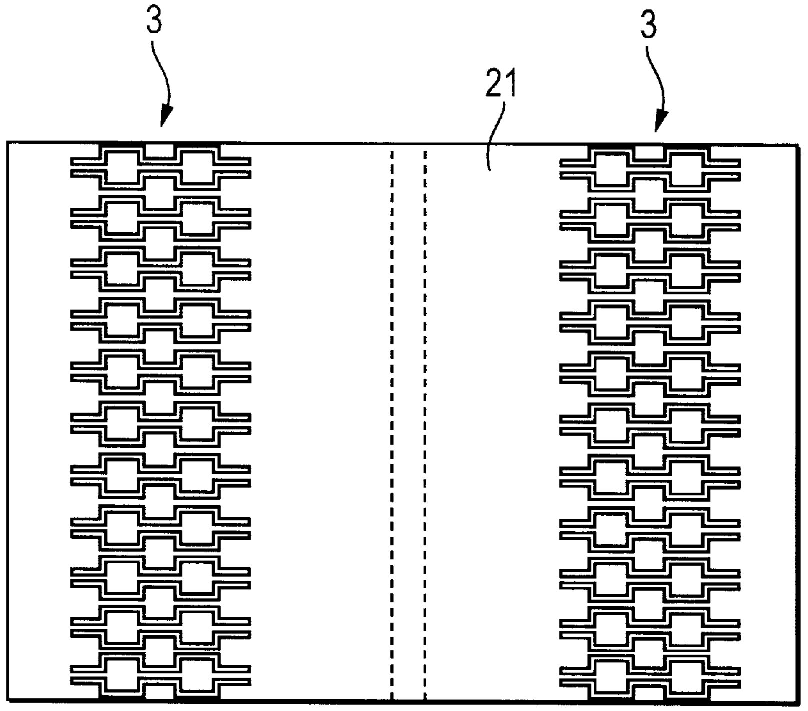

In contrast to the high-frequency circuit device shown in FIG. 13, a high-frequency circuit device shown in FIGS. 14A and 14B includes an electrode 21 formed on the underside of a dielectric plate 20 and electrodes 22 and a grounded slot line 4 formed on the top surface of the dielectric plate 20. The electrode 21 on the underside of the dielectric plate 20 is patterned to form spurious mode propagation blocking circuits 3 on areas corresponding to both sides of the line on the surface.

With the grounded slot line thus constructed, the propagation of the parallel-plate mode is equally blocked.

Figure 15A:
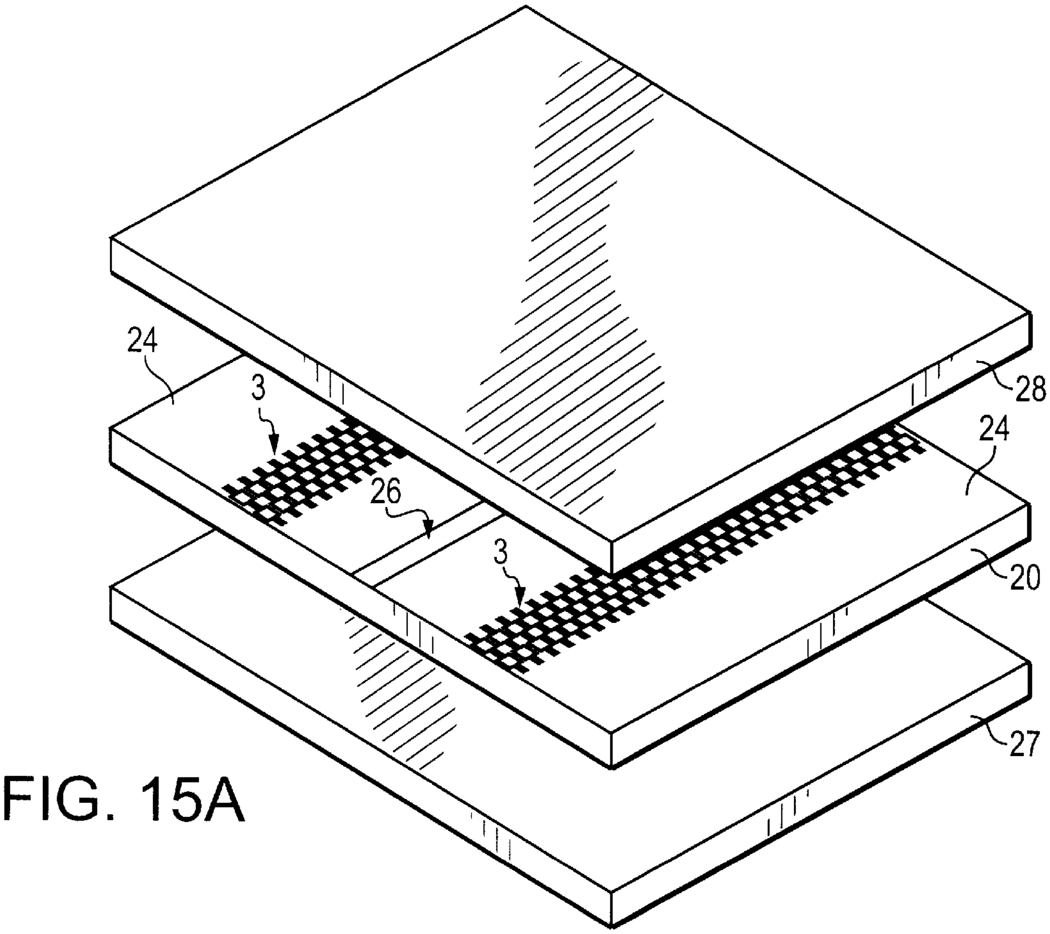
FIGS. 15A and 15B show a planar dielectric line associated with a spurious mode propagation blocking circuit.
Figure 15B:
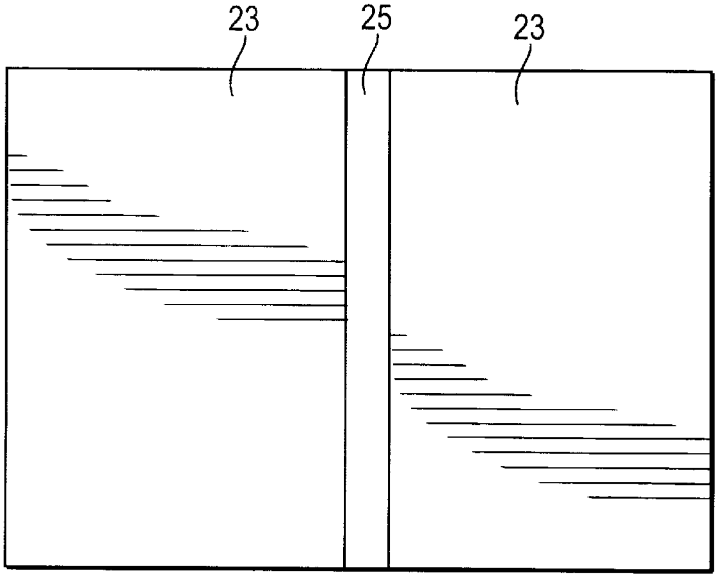

FIGS. 15A and 15B show a high-frequency circuit device employing a planar dielectric transmission line (PDTL). FIG. 15A is a perspective view of the device, and FIG. 15B is an underside view of its dielectric plate 20. The dielectric plate 20 is interposed between opposing electrodes 23 and 24, each having a slot. The dielectric plate 20 and the electrodes 23 and 24 are then interposed between conductive plates 27 and 28 which remain parallel to each other with a predetermined space maintained therebetween. A patent application for the planar dielectric transmission line thus constructed has been filed in the Japanese Patent Office (Japanese Unexamined Patent Publication No. 7-69867).

Spurious mode propagation blocking circuits 3, the same as those shown in FIG. 1, are formed on both sides of a slot 26, by patterning the top electrodes 24 on the dielectric plate 20.

With this arrangement, the parallel-plate mode traveling between the top and bottom electrodes 23 and 24 of the dielectric plate 20, the parallel-plate mode traveling in a space between the electrodes 24 and the conductive plate 28 and the parallel-plate mode traveling in a space between the electrodes 23 and the conductive plate 27 are all converted into the quasi TEM mode of the micro strip of the spurious mode propagation blocking circuits 3, and are then fully reflected. In this way, the propagation of the spurious mode is blocked.

Figure 16A:
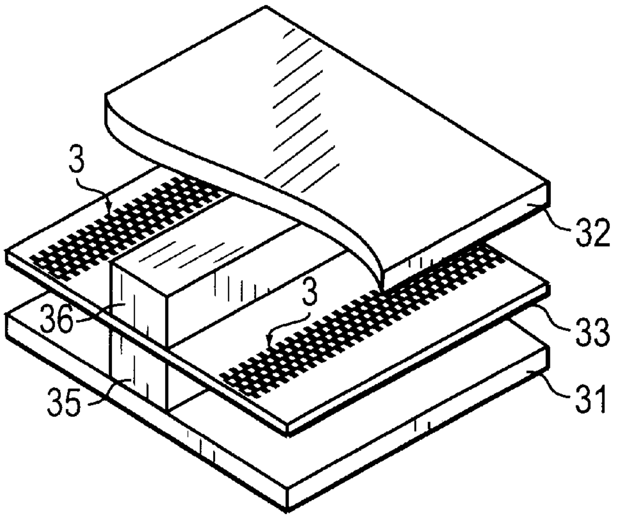
FIGS. 16A and 16B show a dielectric line associated with a spurious mode propagation blocking circuit.
Figure 16B:
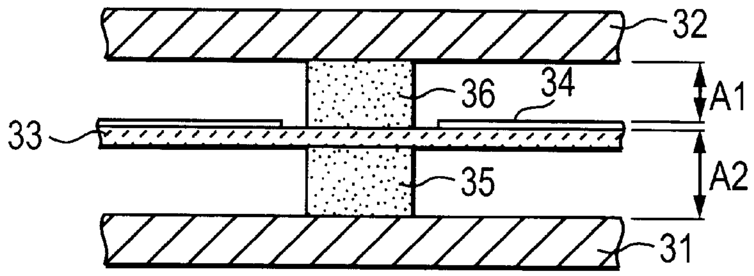

FIGS. 16A and 16B show a high-frequency circuit device having a dielectric transmission line in which the present invention is implemented. FIG. 16A is a perspective view of the device with a portion broken away to reveal the inside of the device. FIG. 16B is a cross-sectional view of the device. Arranged between conductive plates 31 and 32 are dielectric strips 35 and 36 and a dielectric plate 33 having an electrode 34 on its top surface. A nonradiative dielectric guide (NRD guide) thus constructed confines the energy of electromagnetic field to the dielectric strips 35 and 36, thereby permitting the electromagnetic wave to travel therethrough.

The dielectric transmission line generally disturbs the electromagnetic field at its discontinuity section such as a splice of dielectric strips or a bend, permitting the spurious mode, such as the parallel-plate mode, to travel between the top and bottom conductors.

Spurious mode propagation blocking circuits 3 are arranged on both sides of the dielectric strips 35 and 36, by patterning the electrodes 34 on the top surface of the dielectric plate 33. The electromagnetic waves in the parallel-plate mode respectively traveling in a space A1 between the electrodes 34 and the top conductive plate 32 and in a space A2 between the electrodes 34 and the bottom conductive plate 31 are converted into the quasi TEM mode waves through the micro-strip lines of the spurious mode propagation blocking circuits 3, and are then reflected. Leaky waves between this dielectric transmission line and another adjacent transmission line of dielectric strips are prevented from interfering with each other.

Figure 17:
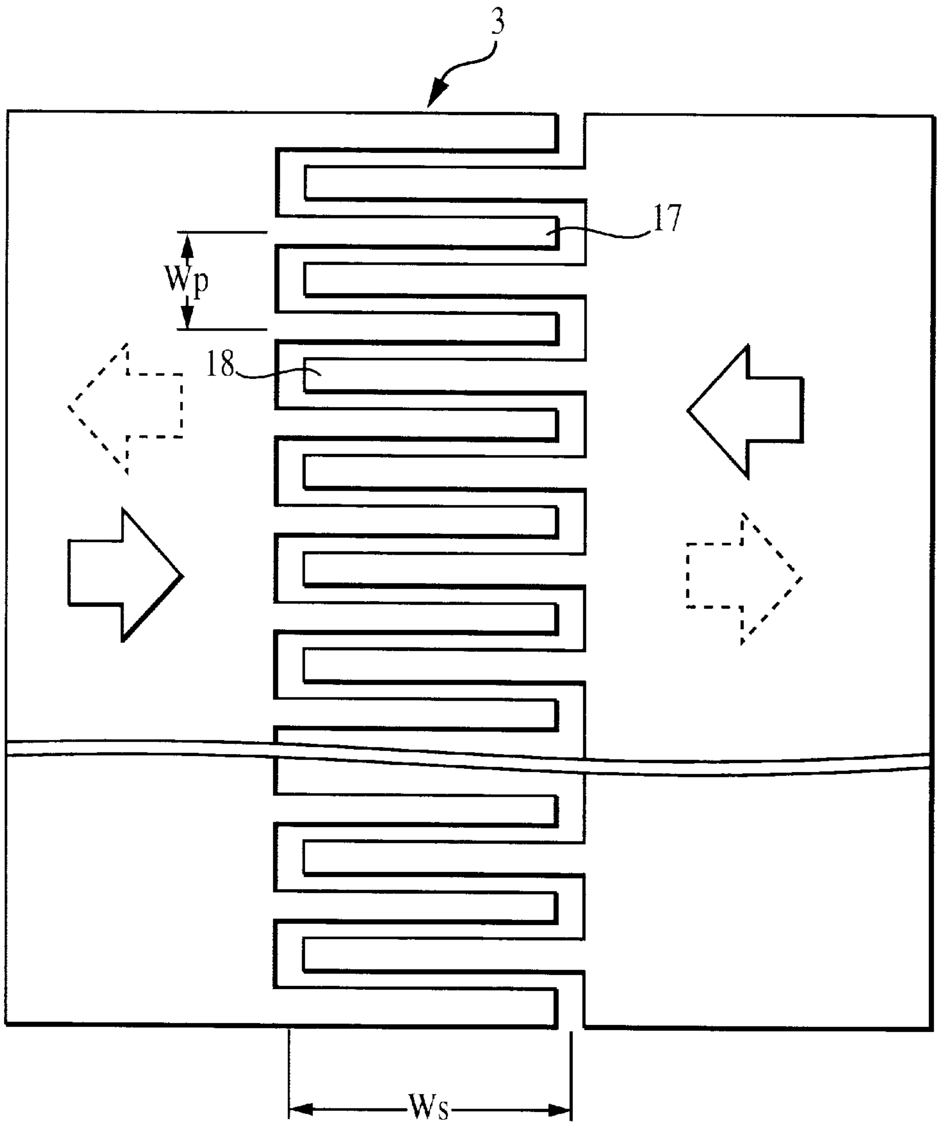
FIG. 17 is a top view showing another spurious mode propagation blocking circuit.

A spurious mode propagation blocking circuit 3 of another embodiment is shown in FIG. 17. In this embodiment, the circuit includes a plurality of micro strip lines, each having an open terminal, arranged in parallel. In this embodiment, micro-strip lines 17 extending rightward and micro-strip lines 18 extending leftward are arranged in an interdigital fashion. Transmission lines (not shown), such as grounded coplanar lines, vertically run along both sides of the spurious mode propagation blocking circuit 3 in FIG. 17. This arrangement blocks the propagation of the spurious mode wave in a direction (as represented by arrows) perpendicular to the direction of propagation of the electromagnetic wave along the lines.

The pitch Wp of the adjacent micro-strip lines is substantially shorter than the wavelength of the parallel-plate mode wave. Such a short pitch of Wp prevents the parallel-plate mode wave from leaking between the micro-strip lines. The length Ws of each micro-strip line is set to be shorter than half the wavelength of a desired frequency (i.e., a frequency of the slot mode wave induced between the adjacent micro-strip lines). With this arrangement, the cutoff frequency of the slot mode is made sufficiently high, and the spurious mode, such as the parallel-plate mode, is not converted into the slot mode. No slot mode is thus converted back into a parallel-plate mode, resulting no traveling parallel-plate mode.

The electromagnetic wave in the spurious mode, such as the parallel-plate mode, traveling between electrodes on the top surface and the bottom surface of the dielectric plate, is converted into the quasi TEM mode on the micro-strip line section. Since the micro-strip line is opened at its terminal, the quasi TEM mode wave is fully reflected there. As a result, almost no spurious mode, such as the parallel-plate mode, travels beyond the spurious mode propagation blocking circuits 3. In the device shown in FIG. 17, including the micro-strip lines 17 extending rightward and the micro-strips lines 18 extending leftward, the parallel-plate mode traveling rightward is blocked by the micro-strip lines 17 and the parallel-plate mode traveling leftward is blocked by the micro-strip lines 18.

Figure 18:
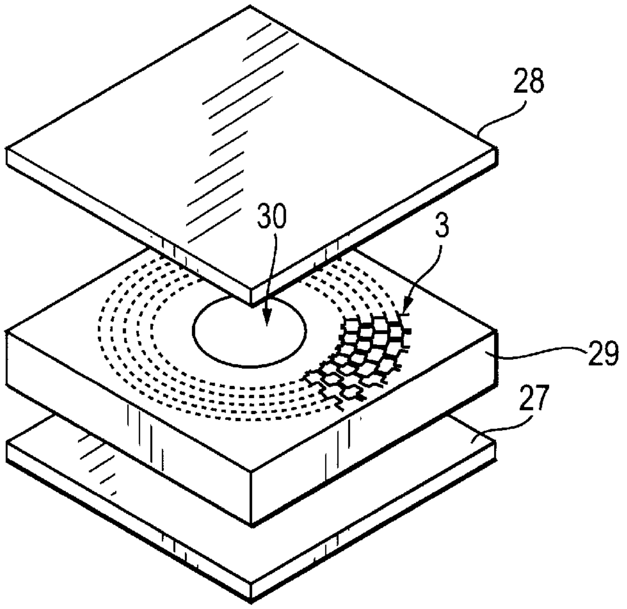
FIG. 18 shows a high-frequency circuit device having a resonator, associated with a spurious mode propagation blocking circuit.
Figure 19:
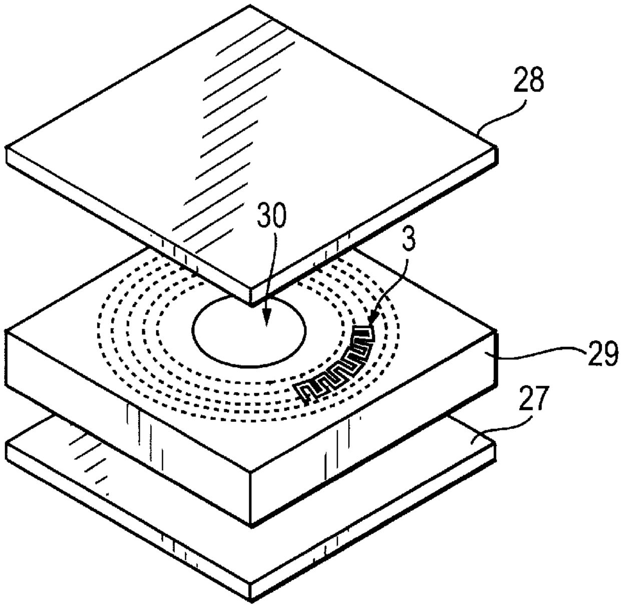
FIG. 19 shows another high-frequency circuit device having a resonator, associated with a spurious mode propagation blocking circuit.
Figure 20:
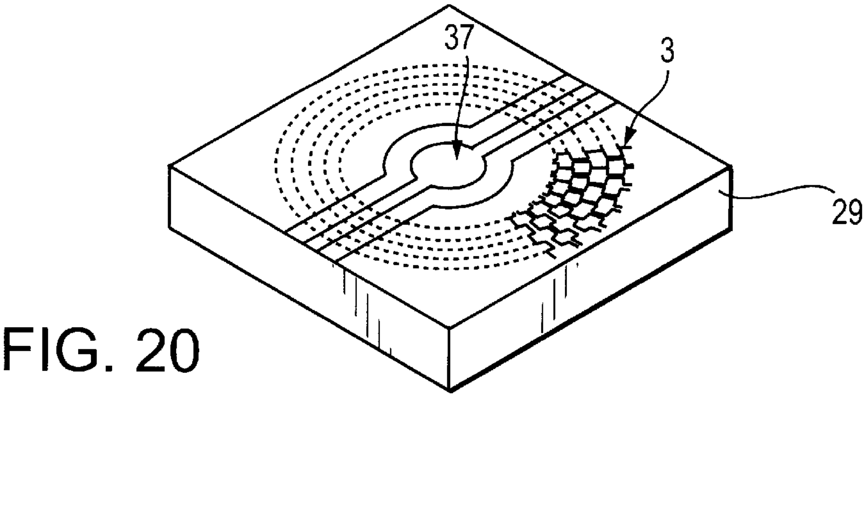
FIG. 20 shows yet another high-frequency circuit device having a resonator, associated with a spurious mode propagation blocking circuit.

Referring to FIG. 18 through FIG. 20, high-frequency circuit devices having a resonator are discussed.

In the high-frequency circuit device shown in FIG. 18, a dielectric plate 29 has one electrode on its top surface and the other electrode on its bottom surface. The two electrodes have respective circular non-conductive portions facing each other. Designated 30 is the circular non-conductive portion arranged on the top electrode. With this arrangement, a resonator, a TE010 mode resonator in this example, is formed with the non-conductive portions working as an electric wall. A spurious mode propagation blocking circuit 3 is patterned on the top electrode of the dielectric plate 29. The spurious mode propagation blocking circuit 3 is constructed by radially arranging, around the resonator, micro-strip lines, each including high-impedance lines and low-impedance lines alternately connected in series as shown in FIG. 1A. The pattern of the spurious mode propagation blocking circuit 3 shown in FIG. 18 corresponds to a pattern, expressed in the polar coordinate system, into which the pattern of the spurious mode propagation blocking circuit 3 shown in FIG. 1A, expressed in the Cartesian coordinate system is converted. Optionally, the wide line width and the narrow line width may be consistently set in dimension along the same micro-strip line. FIG. 18 shows only part of the spurious mode propagation blocking circuit 3.

Some of the energy of the electromagnetic field confined to the dielectric resonator radially spreads in the parallel-plate mode between the top and bottom electrodes on the dielectric plate 29 from the dielectric resonator. The parallel-plate mode wave is then converted into the quasi TEM mode wave and fully reflected by the spurious mode propagation blocking circuit 3. For this reason, almost no spurious mode leaks out of the spurious mode propagation blocking circuit 3. Conversely, almost no spurious mode wave leaks into the spurious mode propagation blocking circuit 3 (toward the resonator). Even if transmission lines or other resonators are present outside the spurious mode propagation blocking circuit 3, no interference takes place between leaky waves.

FIG. 19 shows the high-frequency circuit device shown in FIG. 18, with its spurious mode propagation blocking circuit 3 replaced with another spurious mode propagation blocking circuit. The spurious mode propagation blocking circuit 3 here is constructed by radially arranging, around a resonator, a plurality of micro-strip lines, each having an open terminal. FIG. 19 shows only part of the spurious mode propagation blocking circuit 3. The pattern of the spurious mode propagation blocking circuit 3 shown in FIG. 19 corresponds to a pattern, expressed in the polar coordinate system, into which the pattern of the spurious mode propagation blocking circuit 3 shown in FIG. 17, expressed in the Cartesian coordinate system is converted. The width of each micro strip line is fixed.

Referring to FIG. 20, an electrode is formed on the entire bottom surface of a dielectric plate 29, and a circular resonator electrode 37 is formed on the top surface of the dielectric plate 29. The arrangement results in a planar circuit resonator. The resonator functions as a TM011 mode dielectric resonator with the resonator electrode 37 as an electric wall. A spurious mode propagation blocking circuit 3 is also patterned on the top electrode of the dielectric plate 29.

A spurious mode propagation blocking circuit 3 can be formed on the bottom electrode entirely covering the underside of the dielectric plate 29. In the same manner as in FIG. 19, the spurious mode propagation blocking circuit 3 here can be constructed by radially arranging, around a resonator, a plurality of micro-strip lines, each having an open terminal.

Figure 21:
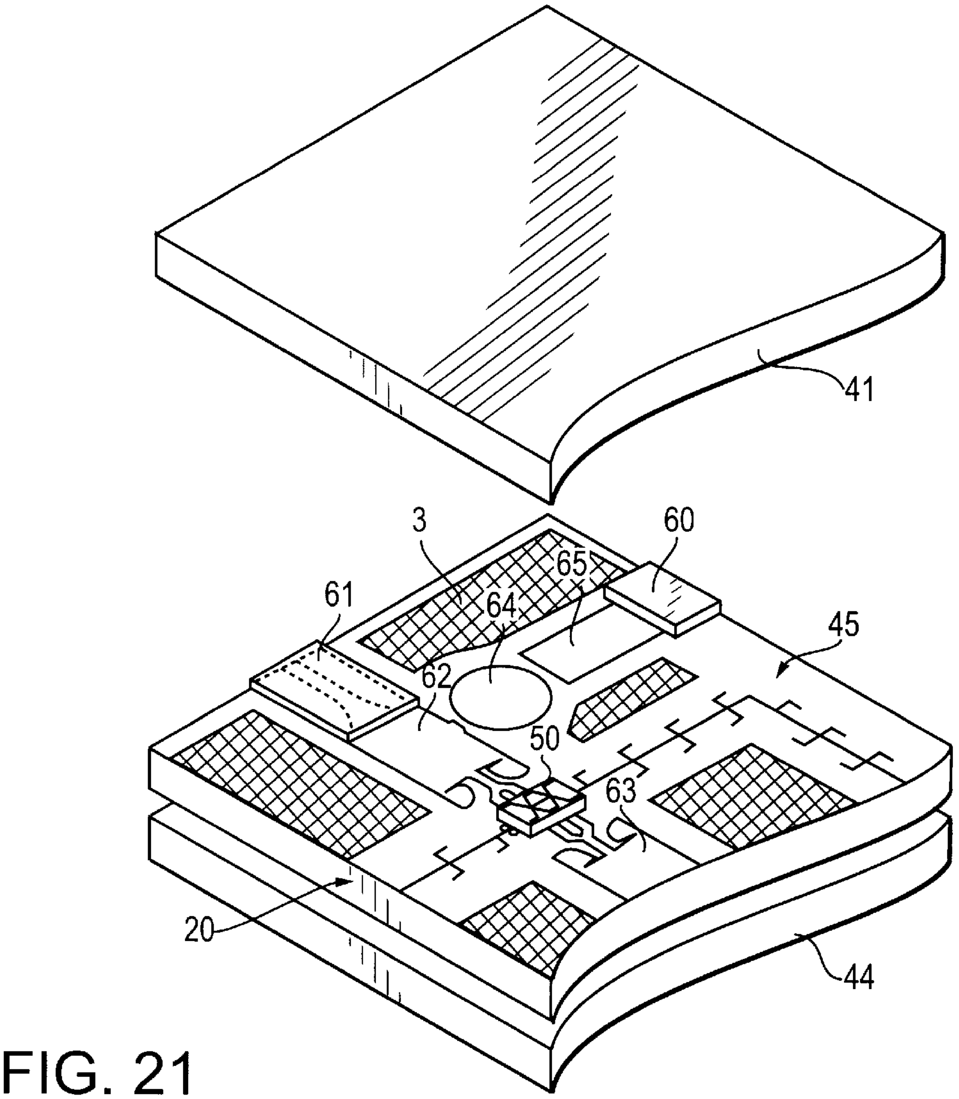
FIG. 21 shows the construction of a voltage-controlled oscillator.
Figure 22:
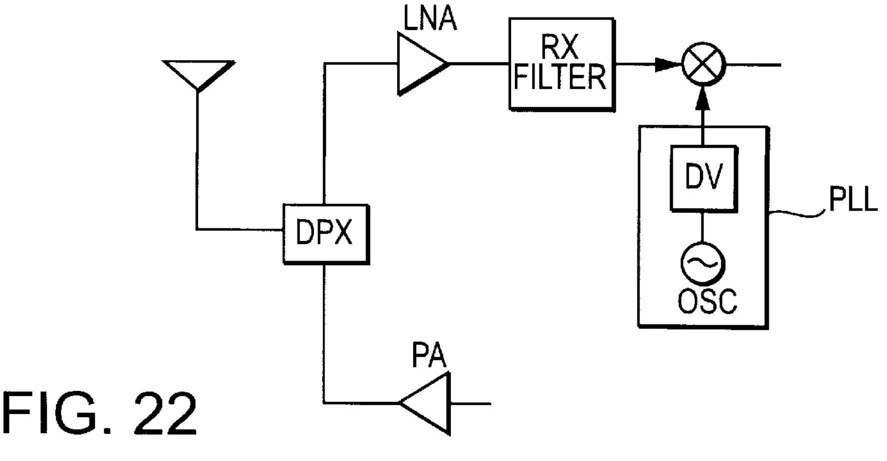
FIG. 22 shows the construction of a communication apparatus.

A voltage-controlled oscillator is now discussed, referring to FIG. 21 and FIG. 22.

FIG. 21 is a perspective view showing the construction of the voltage-controlled oscillator. A dielectric plate 20 is interposed between top and bottom conductive plates 41 and 44 (the top conductive plate 41 is shown spaced apart from the dielectric plate 20 in FIG. 21). The dielectric plate 20 has conductive patterns on its top and bottom surfaces. A slot transmission line input field-effect transistor (millimeter-wave GaAs FET) 50 is mounted on the top surface of the dielectric plate 20. Each of slots 62 and 63, formed on the top surface of the dielectric plate 20, maintains a fixed space between two respective electrodes, and constitute a planar dielectric transmission line along with slots on the underside of the dielectric plate 20. Coplanar lines 45 feed a gate bias voltage and a drain bias voltage to FET 50.

A thin-film resistor 61 is disposed above the slot 62 which is tapered toward its end. A slot 65 is arranged on the top surface of the dielectric plate 20, and another slot is formed on the bottom surface of the dielectric plate 20. These slots constitute a planar dielectric transmission line. A variable capacitance element 60, mounted straddling the slot 65, changes its capacitance in accordance with an input voltage. A non-conductive portion 64 for a dielectric resonator is arranged on the top surface of the dielectric plate 20, and constitutes a TE010 mode dielectric resonator along with a dielectric resonator non-conductive portion formed on the bottom surface of the dielectric plate 20.

Spurious mode propagation blocking circuits 3 are formed on cross-hatched areas shown in FIG. 21. The dielectric plate 20 also has, on its corresponding bottom surface areas, spurious mode propagation blocking circuits 3. The spurious mode propagation blocking circuits 3 thus arranged prevent interference between leaky waves taking place in the planar dielectric transmission line of the slot 63, the planar dielectric transmission line of the slot 65 and the dielectric resonator of the non-conductive portion 64.

FIG. 22 is a block diagram showing the construction of a communication apparatus employing the above-referenced voltage-controlled oscillator. Referring to FIG. 22, a power amplifier PA feeds a transmission signal to a duplexer DPX. A received signal is fed from DPX to a low-noise amplifier LNA and an RX filter (receiving filter), and then to a mixer. A PLL (phase-locked loop) local oscillator is composed of an oscillator OSC and a frequency divider DV for frequency-dividing an oscillation signal. The PLL local oscillator provides the mixer with a local oscillation signal. The above-referenced voltage-controlled oscillator is used as the oscillator OSC.

Furthermore, high-frequency circuit devices need to treat multiple reflections of the spurious mode. Discussed below are high-frequency circuit devices presenting high spurious suppression capability in directions other than a direction perpendicular to the direction of propagation of the spurious mode, referring to FIG. 23A through FIG. 26.

A basic circuit pattern is composed of a serial inductor L and a parallel capacitor C connected in series, which is a basic circuit of an LPF (low-pass filter). A multi-port circuit functioning in multiple directions is constructed by connecting a plurality of basic circuit patterns.

Figure 23A:
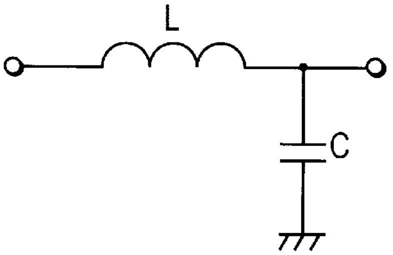
FIGS. 23A, 23B and 23C show basic circuit arrangements of the spurious mode propagation blocking circuit.
Figure 23B:
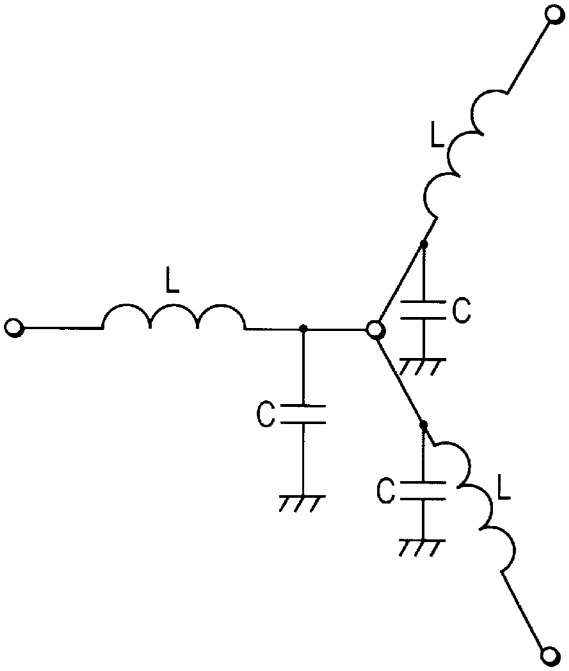

FIG. 23A shows the basic circuit of the LPF, and FIG. 23B shows a circuit in which three basic circuits are connected in three directions. In this circuit, parallel capacitors are expressed as a single C as shown in FIG. 23C.

Figure 23C:
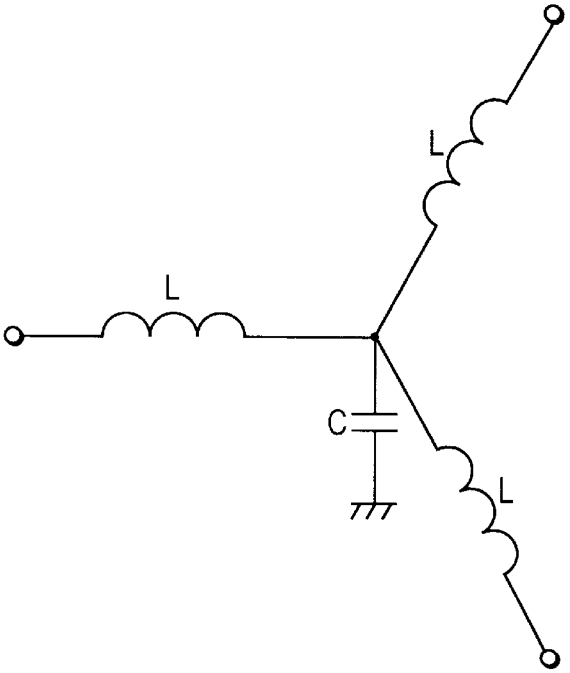
Figure 24:
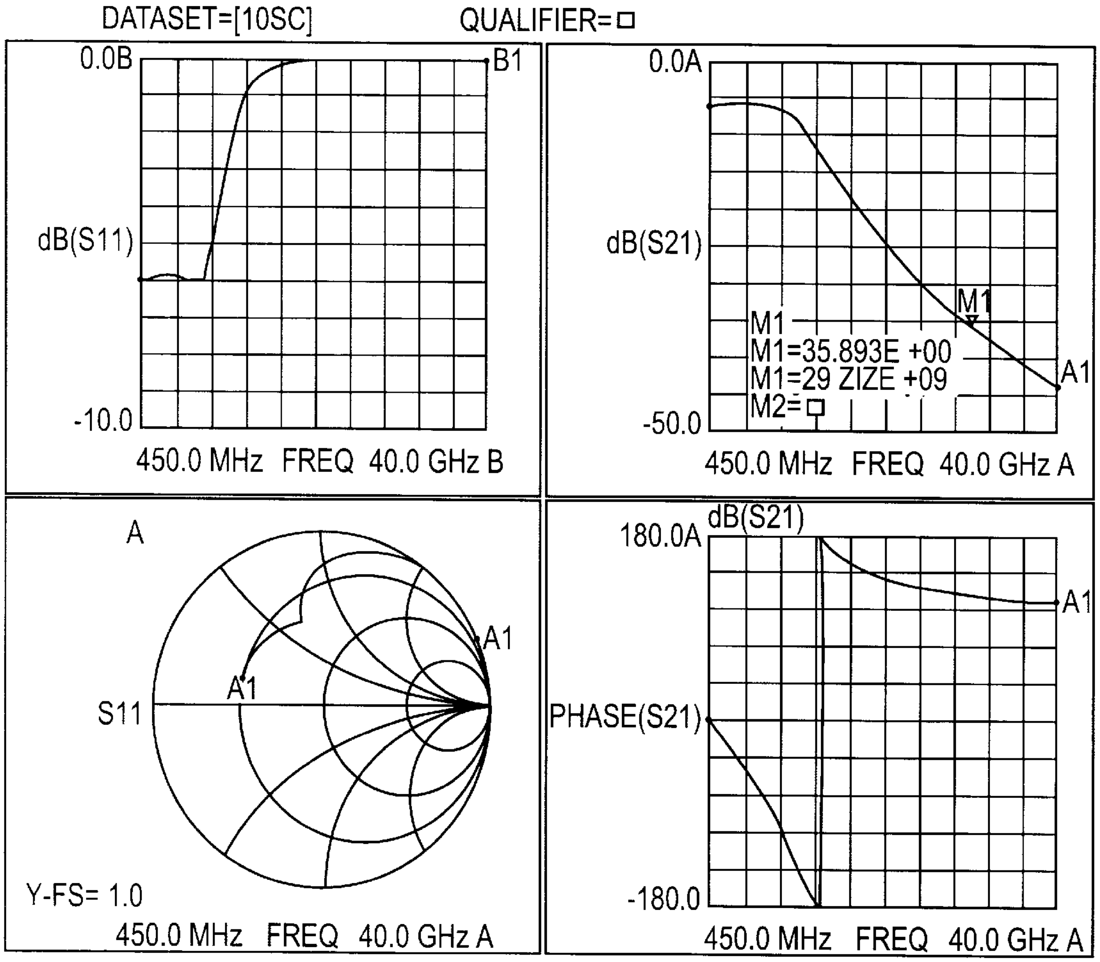
FIG. 24 shows electrical characteristics of the circuit shown in FIG. 23C.

FIG. 24 shows electrical characteristics of the circuit shown in FIG. 23C. As can be seen from FIG. 24, the reflection coefficient at any port increases with frequency.

Figure 25A:
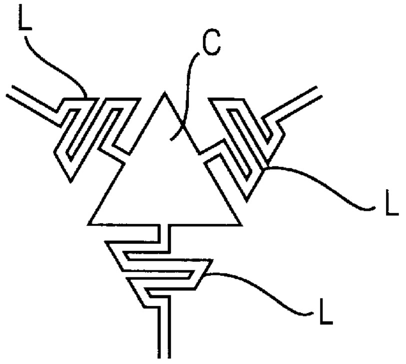
FIGS. 25A and 25B show a two-dimensional arrangement of the basic circuit shown in FIG. 23C.
Figure 25B:
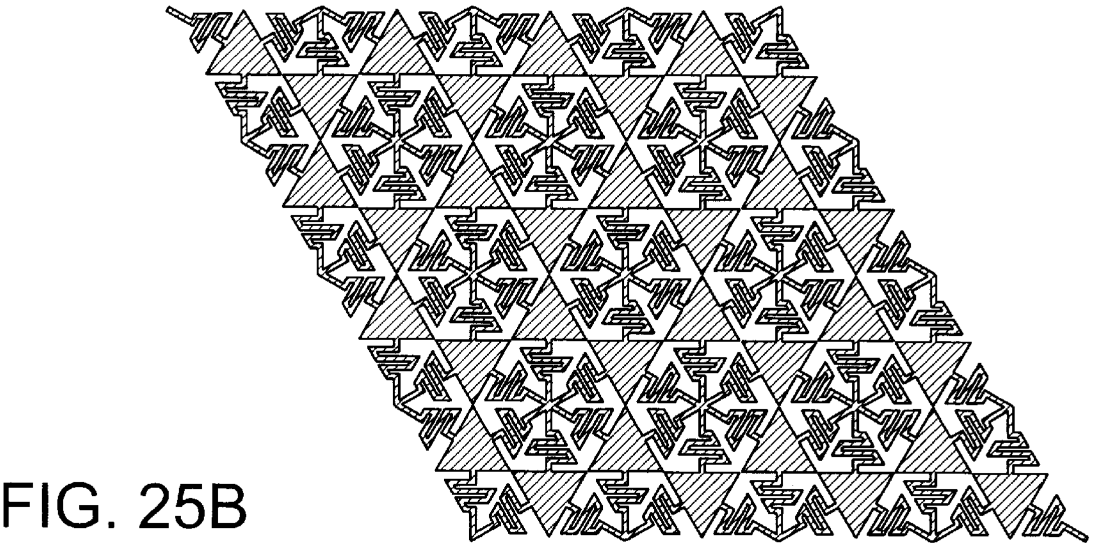

FIGS. 25A and 25B show one embodiment in which the basic circuit shown in FIG. 23C is two-dimensionally arranged. FIG. 25A shows a basic conductor pattern, and FIG. 25B shows part of a conductor pattern including a plurality of basic conductor patterns of FIG. 25A. A conductor pattern represented by the letter 'C' denotes a parallel capacitance formed with a grounded electrode arranged on the other surface of a dielectric plate. A conductor pattern represented by the letter 'L' forms a serial inductor L. The conductor patterns C and L can be treated as a lumped circuit if they are short enough relative to the wavelength (specifically, equal to or shorter than one-eighth the wavelength). Even if they are larger than that size, the circuit still functions as an LPF. The present invention sets no particular limitation on the size of the conductor pattern.

Each apex of a triangular conductor pattern forming the parallel capacitance is not in contact with and is electrically insulated from the apex of an adjacent triangular conductor pattern.

The conductor patterns L, each forming an inductor, are arranged at three equally spaced angular directions with 120 degrees apart from each other. The high-frequency circuit device couples with the spurious mode traveling in the direction in which the conductor pattern L extends, thereby blocking the spurious mode traveling in that direction. In any direction other than the direction in which the conductor pattern L extends, the high-frequency circuit device couples with the spurious mode in accordance with the component of the conductor pattern L in that direction, and thereby couples with the spurious mode traveling in any direction, blocking the propagation of the spurious mode.

Figure 26:
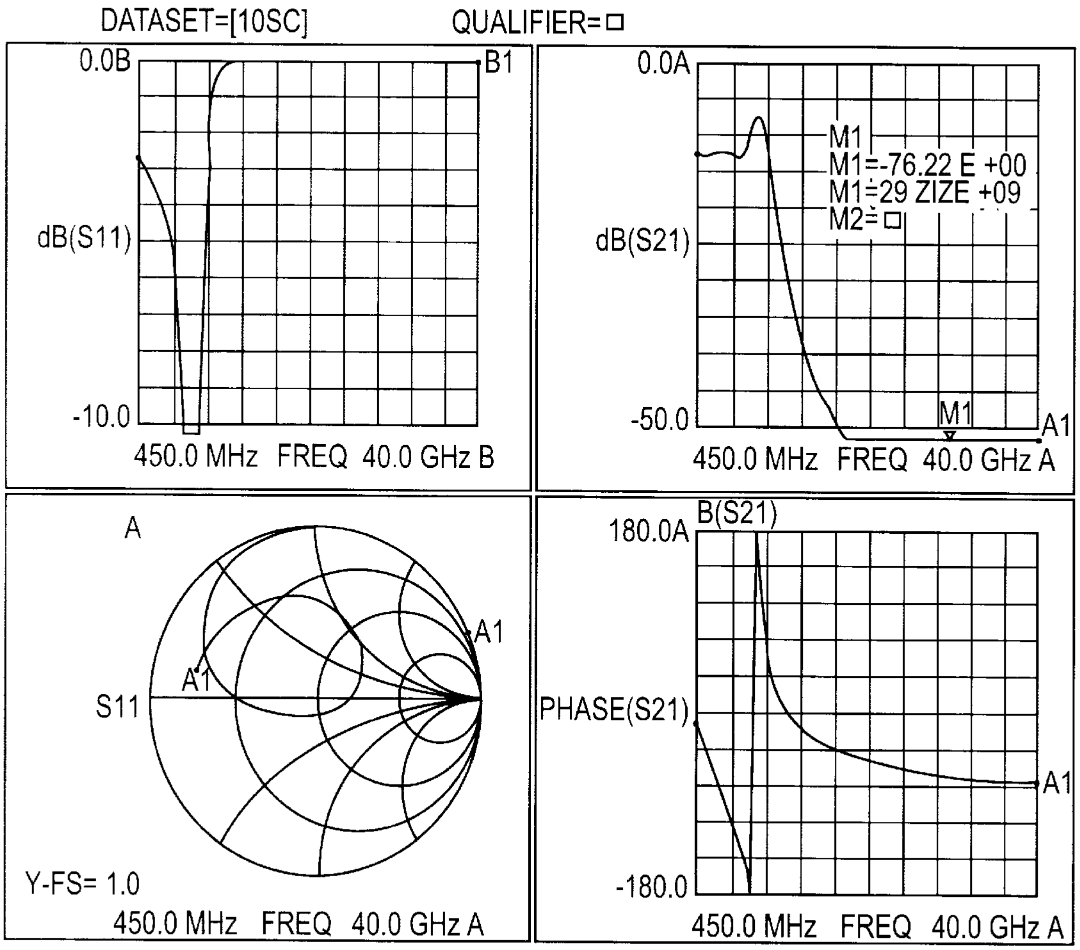
FIG. 26 shows electrical characteristics of the circuit shown in FIGS. 25A and 25B.

FIG. 26 shows electrical characteristics of the circuit shown in FIG. 25B. As can be seen from the comparison with FIG. 24, a two-dimensional arrangement of the basic circuits (i.e., basic patterns) permits the spurious mode to be reflected from lower frequency upward. The high-frequency circuit device thus offers an even higher spurious mode propagation blocking effect.

High-frequency circuit devices employing other LPF basic circuits are now discussed, referring to FIG. 27 through FIG. 32B.

Figure 27:
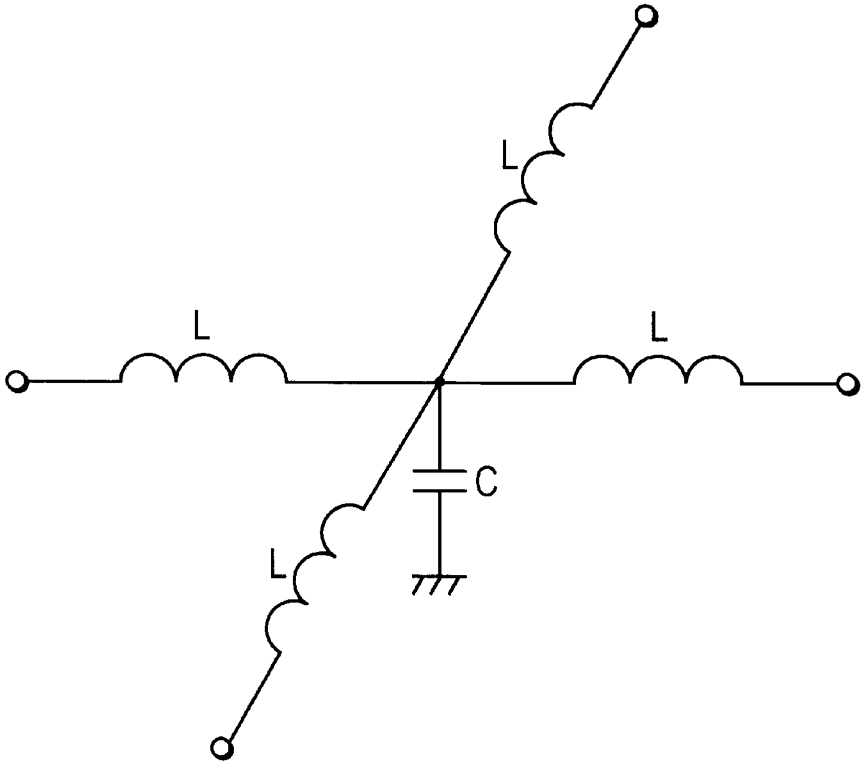
FIG. 27 shows a basic circuit of the spurious mode propagation blocking circuit.
Figure 28A:
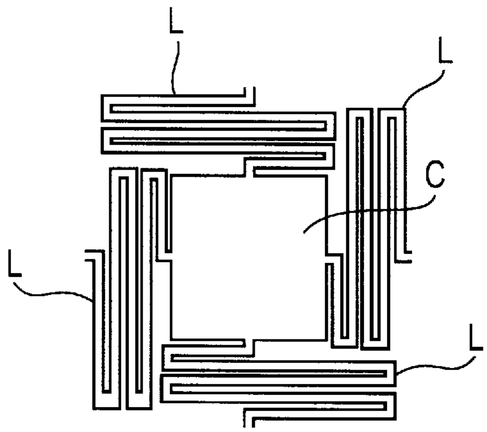
FIGS. 28A and 28B show a two-dimensional arrangement of the basic circuit shown in FIG. 27.
Figure 28B:
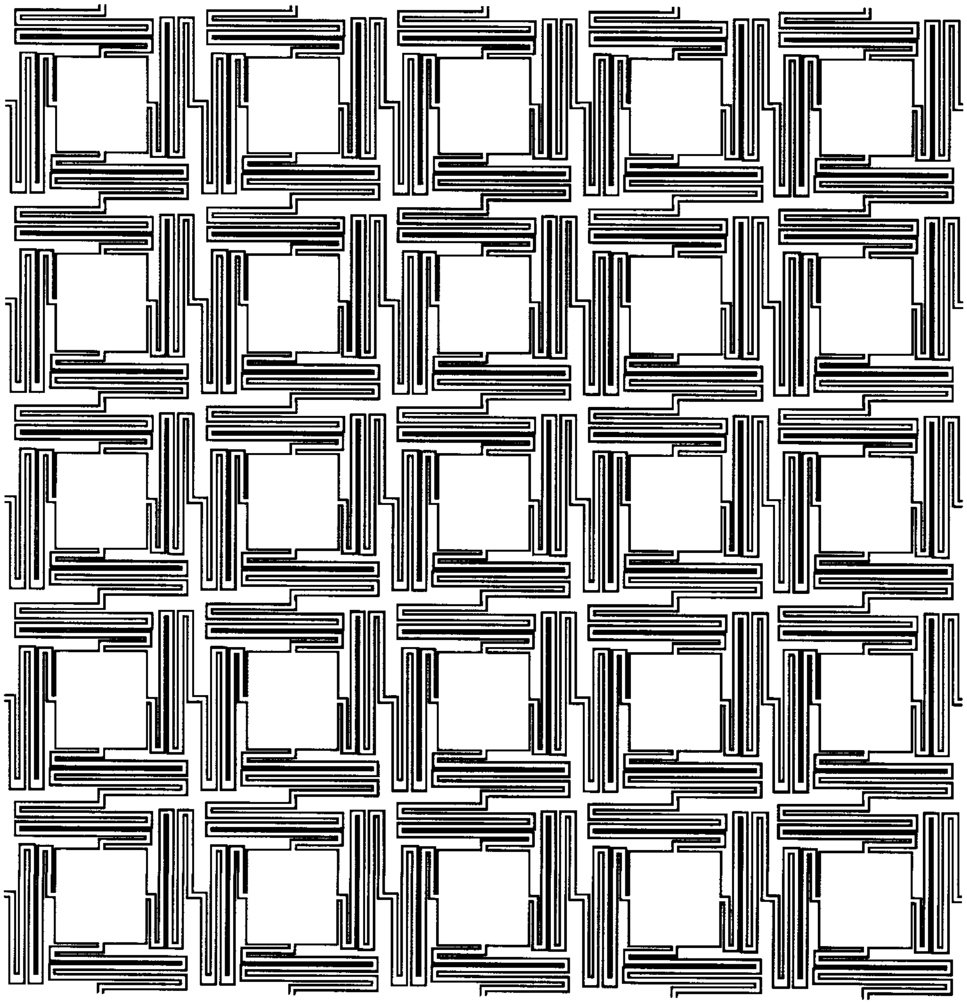

FIG. 27 shows a basic LPF circuit composed of one parallel capacitor C and four serial inductors L. FIG. 28A shows a basic pattern of a two-dimensional arrangement of the basic LPF circuit. FIG. 28B shows part of a conductor pattern including a plurality of basic patterns. Referring to FIG. 28A, a conductor pattern represented by the letter 'C' denotes a parallel capacitor formed with a grounded electrode arranged on the other surface of a dielectric plate. A conductor pattern represented by the letter 'L' forms a serial inductor L.

Figure 29:
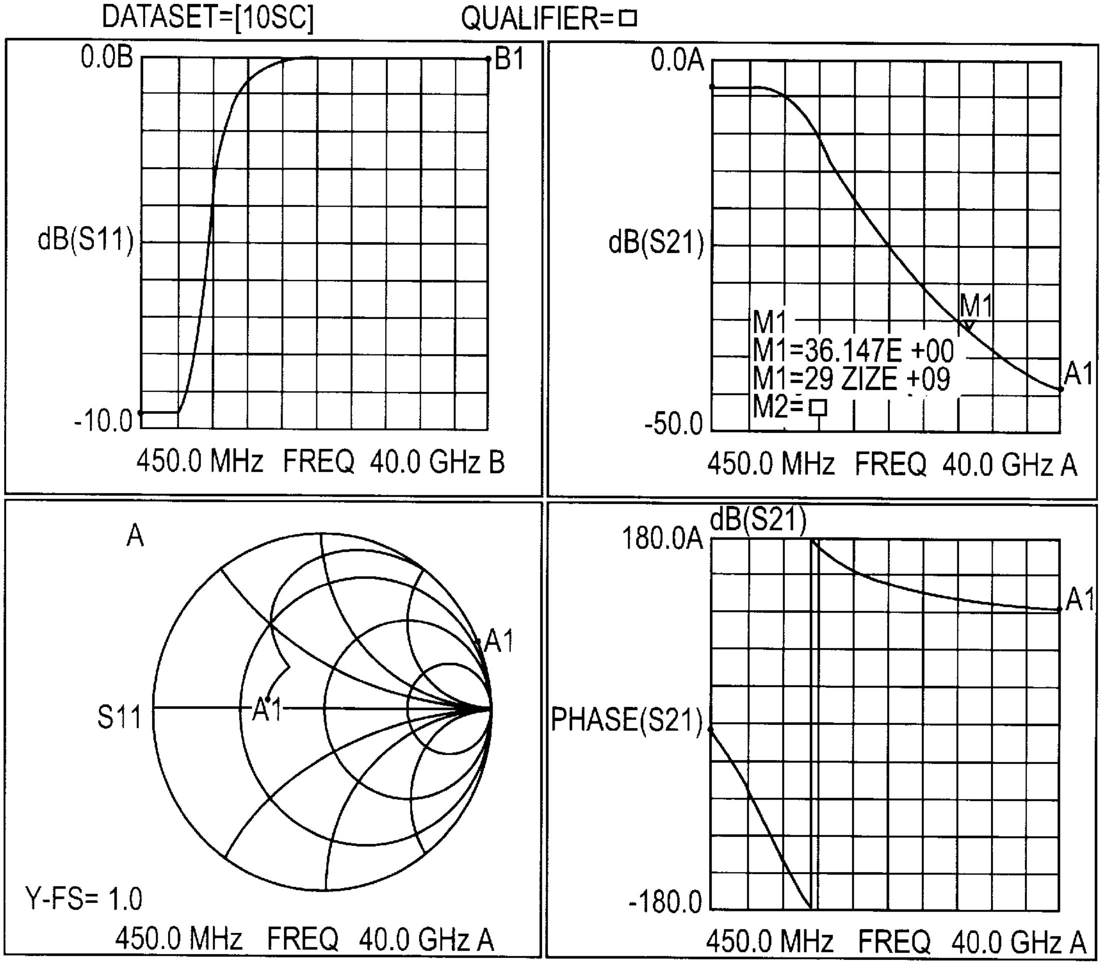
FIG. 29 shows electrical characteristics of the circuit shown in FIGS. 28A and 28B.

FIG. 29 shows electrical characteristics of the circuit shown in FIG. 28B. As seen from FIG. 29, the reflection coefficient at any port increases with frequency. The high-frequency circuit device couples with the spurious mode at a high frequency region, thereby blocking the propagation of the spurious mode.

Figure 30A:
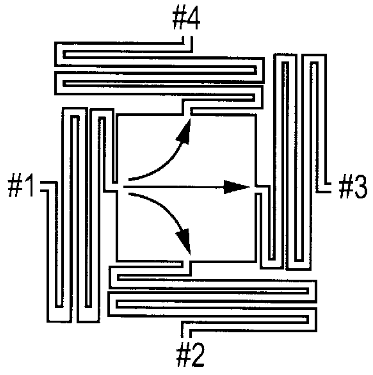
FIGS. 30A through 30D show the basic circuit shown in FIG. 28A and its modification.
Figure 30B:
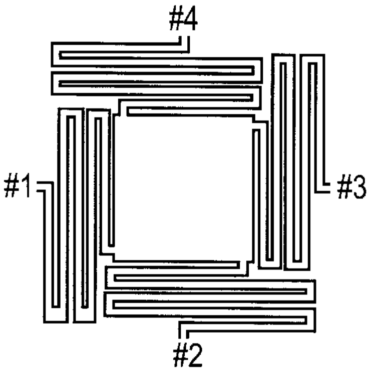

According to the theory of planar circuits, incident waves from one port are not evenly distributed among the three other ports in the conductor pattern shown in FIG. 28A. Referring to FIG. 30A, the direction of Poynting vector from port #1 coincides with port #3, but is perpendicular to ports #2 and #4. As shown in FIG. 30B, the conductor pattern is arranged so that ports #1 and #3 are not aligned and so that ports #3 and #4 are not aligned. The effectiveness of the circuit is thus enhanced in the conductor pattern shown in FIG. 30B.

Figure 30C:
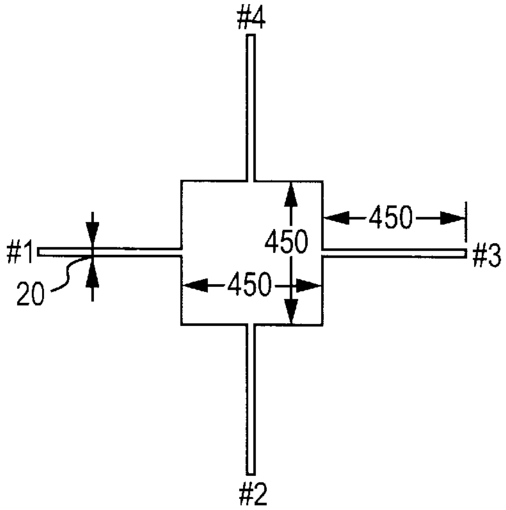
Figure 30D:
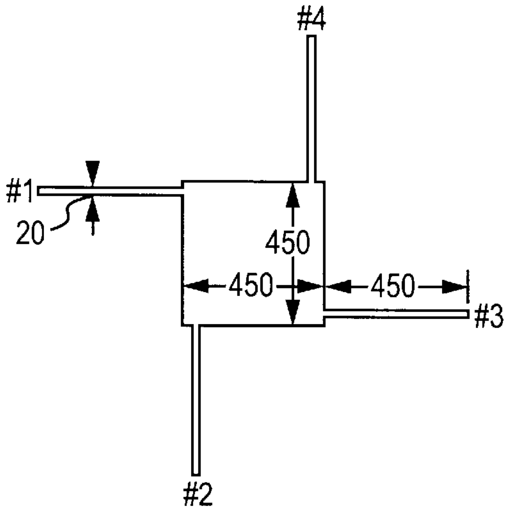

Conductor patterns shown in FIGS. 30C and 30D are the ones that were actually tested for circuit analysis. The unit of measurement used is $\mu$m.

Figure 31A:
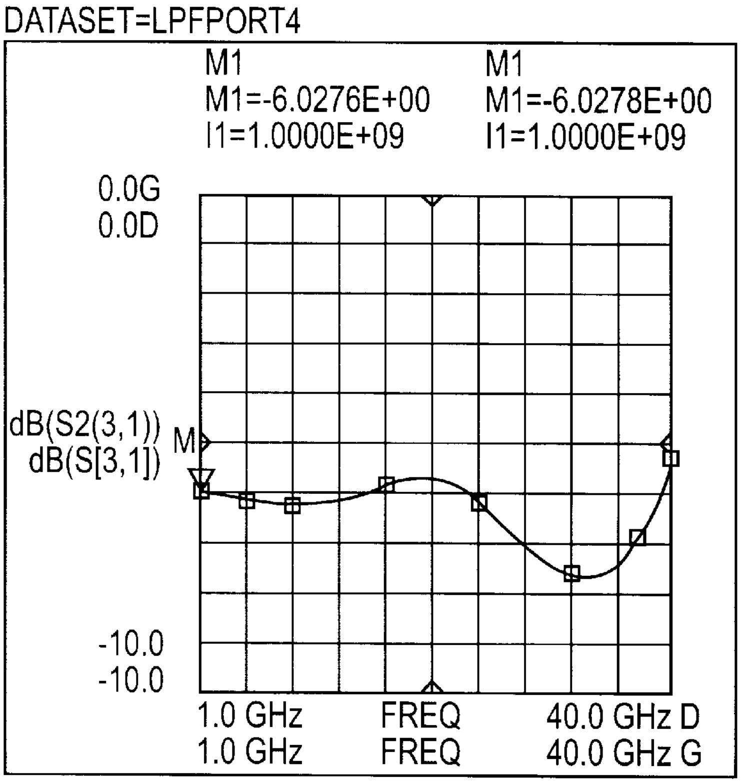
FIGS. 31A and 31B show electrical characteristics of the circuit shown in FIG. 30C.
Figure 31B:
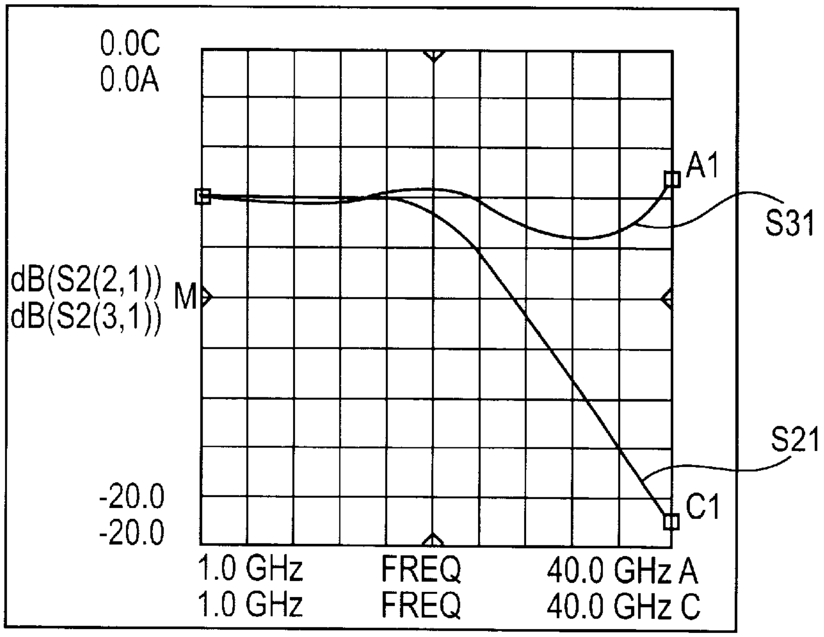
Figure 32A:
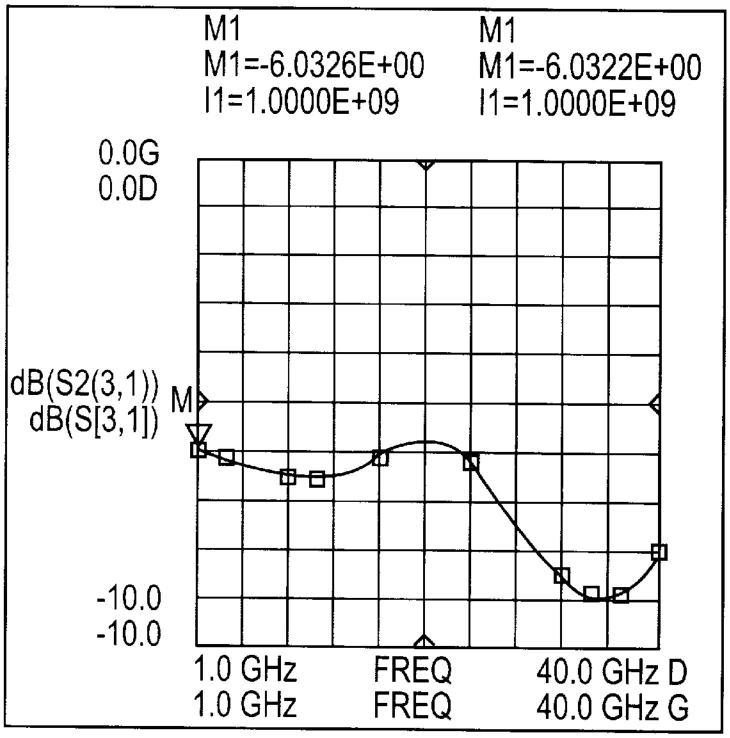
FIGS. 32A and 32B show electrical characteristics of the circuit shown in FIG. 30D.
Figure 32B:
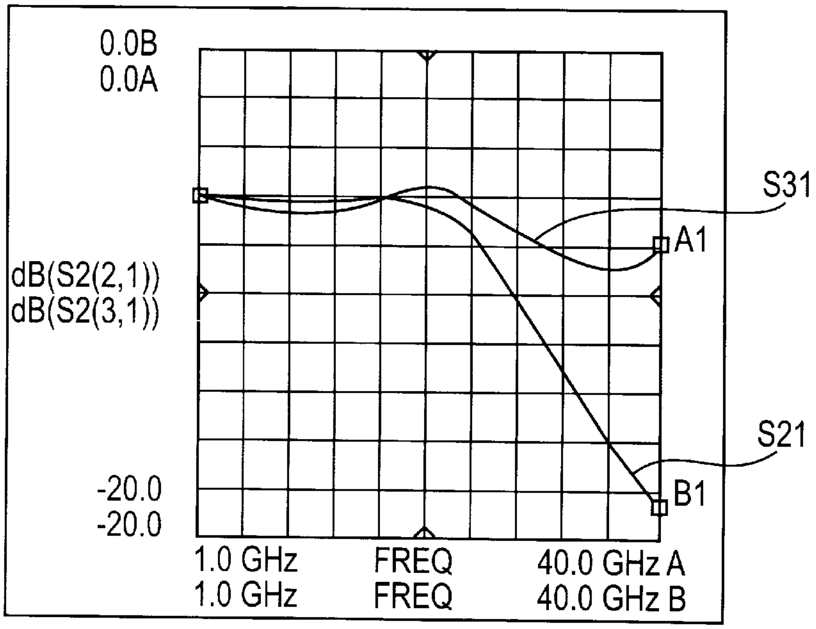

FIGS. 31A and 31B show analysis results of the conductor pattern shown in FIG. 30C. FIG. 32A and 32B show analysis results of the conductor pattern shown in FIG. 30D. The S31 characteristic (i.e., a transmitted quantity) is improved by the conductor pattern in which ports #1 and #3 are not aligned with each other and ports #2 and #4 are not aligned with each other.

Figure 33A:
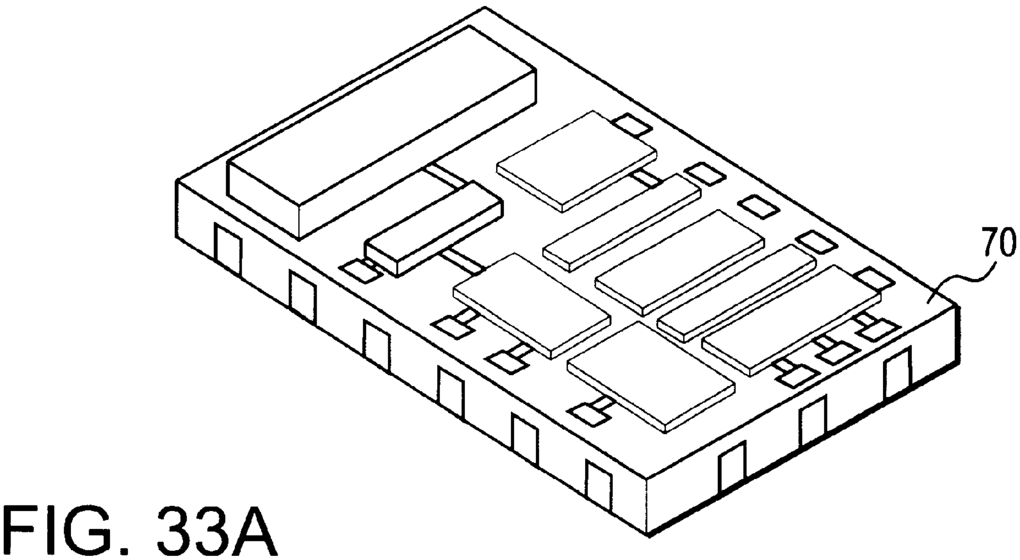
FIGS. 33A and 33B show a high-frequency module having a spurious mode propagation blocking circuit.
Figure 33B:
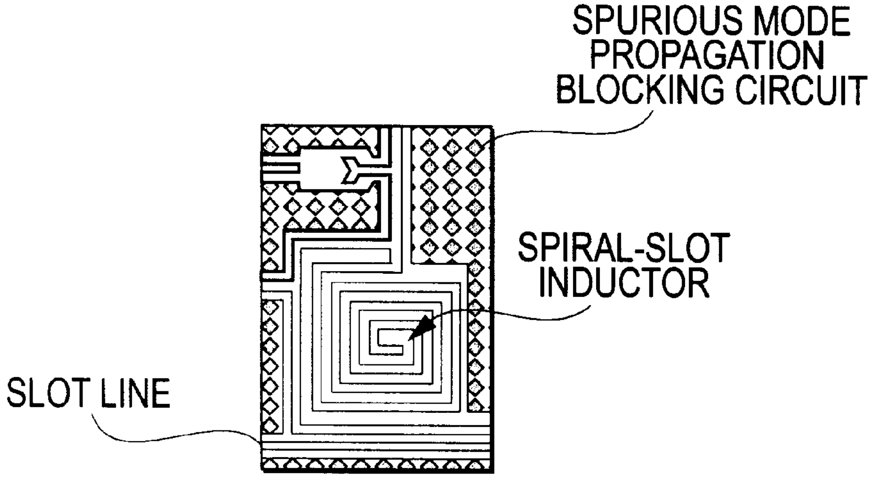

FIGS. 33A and 33B show a high-frequency module employing a spurious mode propagation blocking circuit in which the conductor pattern shown in FIG. 30B is two-dimensionally arranged as shown in FIG. 30A. FIG. 33A is a perspective view of the entire module. This high-frequency module has a plurality of chip integrated circuits mounted on a substrate 70, and works in a frequency range of 2 to 30 GHz, for example. FIG. 33B is an enlarged plan view of one integrated circuit. The integrated circuit has a spiral inductor and slot transmission lines on a substrate, and forms a matching circuit which is equivalently constructed of a transmission line and an inductor connected in parallel. The above-described spurious mode propagation blocking circuit is formed outside the area where the slot transmission line and the spiral slot inductor are arranged.

If the slot transmission line has a branch or a bend, the spurious mode is created there. If the slot transmission line is constructed of a planar conductor, with no spurious mode propagation blocking circuit associated therewith, the spurious mode wave will travel between parallel planar conductors, coupling with the spiral inductor or increasing parasitic capacitance. As a result, the communication module causes radio interference. The characteristics of each component substantially deviate from their intended design values, making the overall design of the module difficult.

If the above-described spurious mode propagation blocking circuit is formed outside the area where the slot transmission line and the spiral slot inductor are arranged, the spurious mode, created at a branch or a bend on the slot transmission line, is absorbed by the spurious mode propagation blocking circuit. No spurious mode wave will couple with the spiral inductor and parasitic capacitance will not increase.

Figure 34:
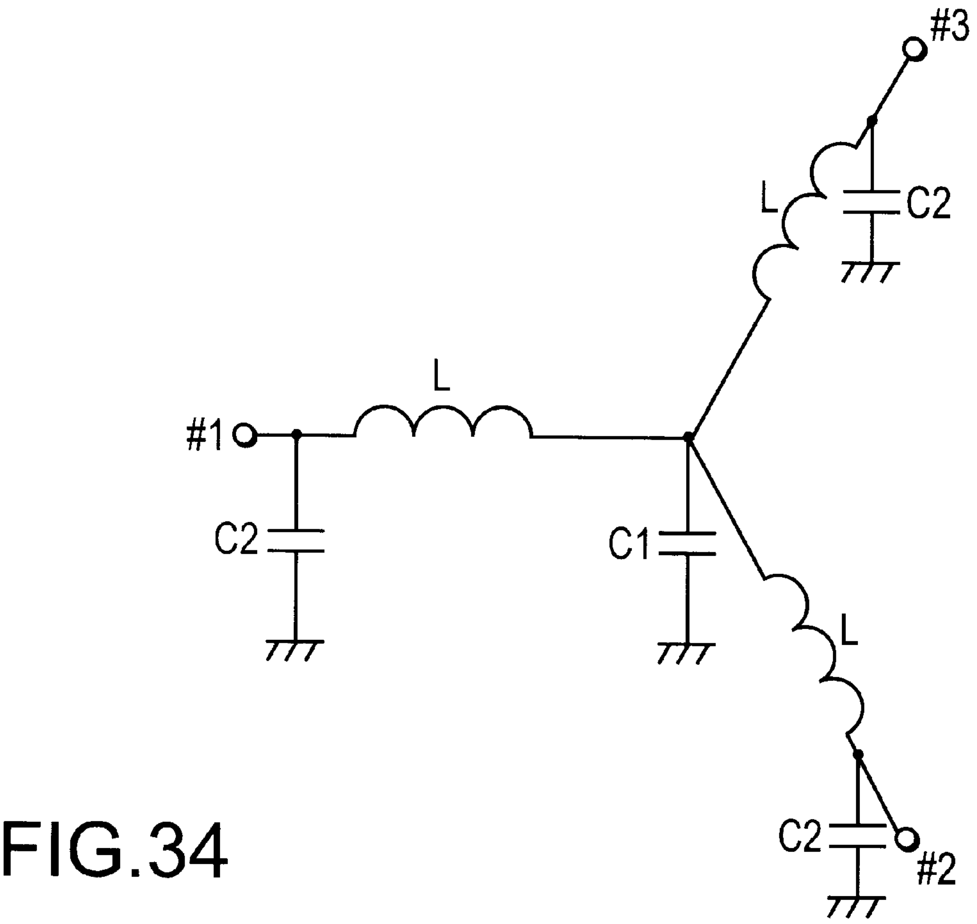
FIG. 34 shows a basic circuit of the spurious mode propagation blocking circuit.
Figure 35A:
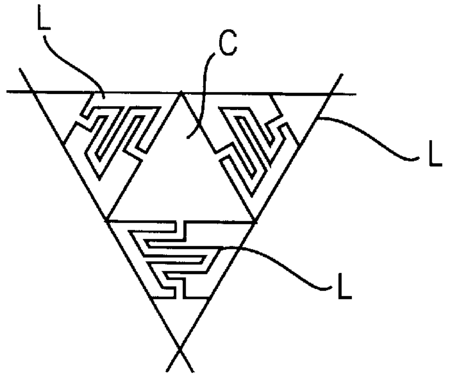
FIGS. 35A and 35B show a two-dimensional arrangement of the basic circuit shown in FIG. 34.
Figure 35B:
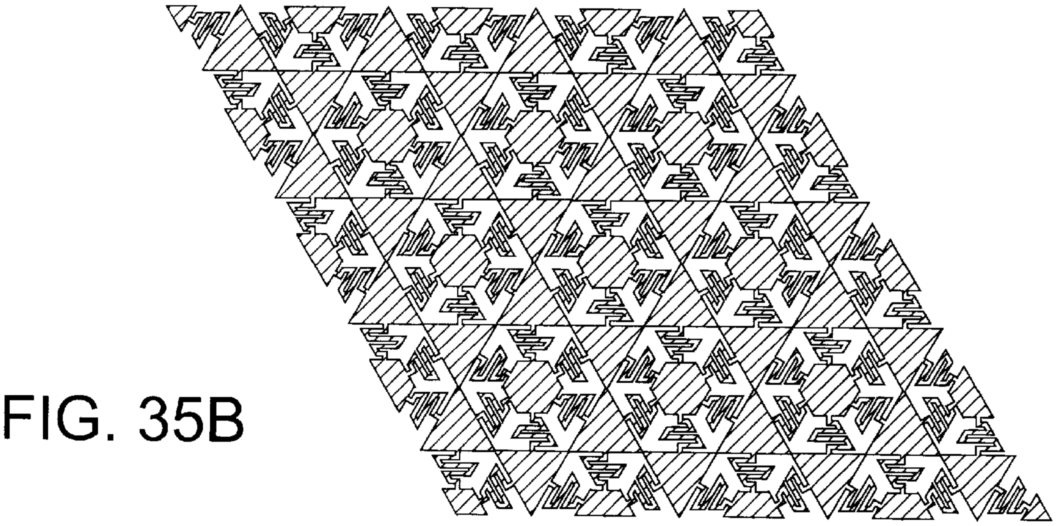

FIG. 34 and FIG. 35A and 35B show another embodiment of a three-port circuit. FIG. 34 shows a three-port basic circuit. This circuit is the circuit shown in FIG. 23C with a parallel capacitor C2 connected to the input/output port of each inductor L.

FIG. 35A shows a basic conductor pattern, and FIG. 35B shows part of the conductor pattern including a plurality of basic patterns. Referring to FIG. 35A, the conductor patterns represented by C1 and C2, form parallel capacitors C1 and C2, shown in FIG. 34, along with a grounded electrode arranged on the other side of a dielectric plate. The conductor pattern represented by L forms a serial inductor L shown in FIG. 34.

Each apex of a triangular conductor pattern forming the parallel capacitance C1 is not in contact with and is electrically insulated from the apex of an adjacent triangular conductor pattern.

By arranging the parallel capacitor C2 at a junction position between adjacent basic patterns of line, the number of stages of LC ladders is increased. The spurious mode propagation blocking capability is even more enhanced.

Figure 36A:
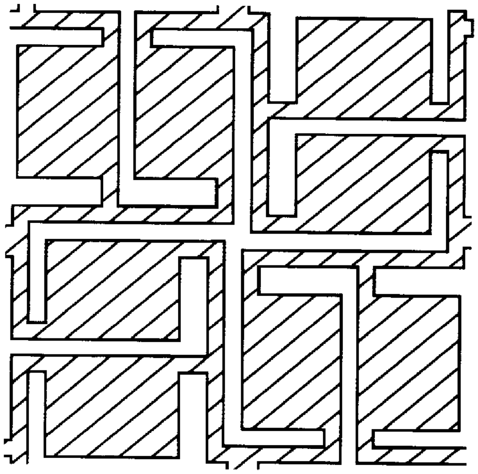
FIGS. 36A and 36B show a basic pattern of the spurious mode propagation blocking circuit.
Figure 36B:
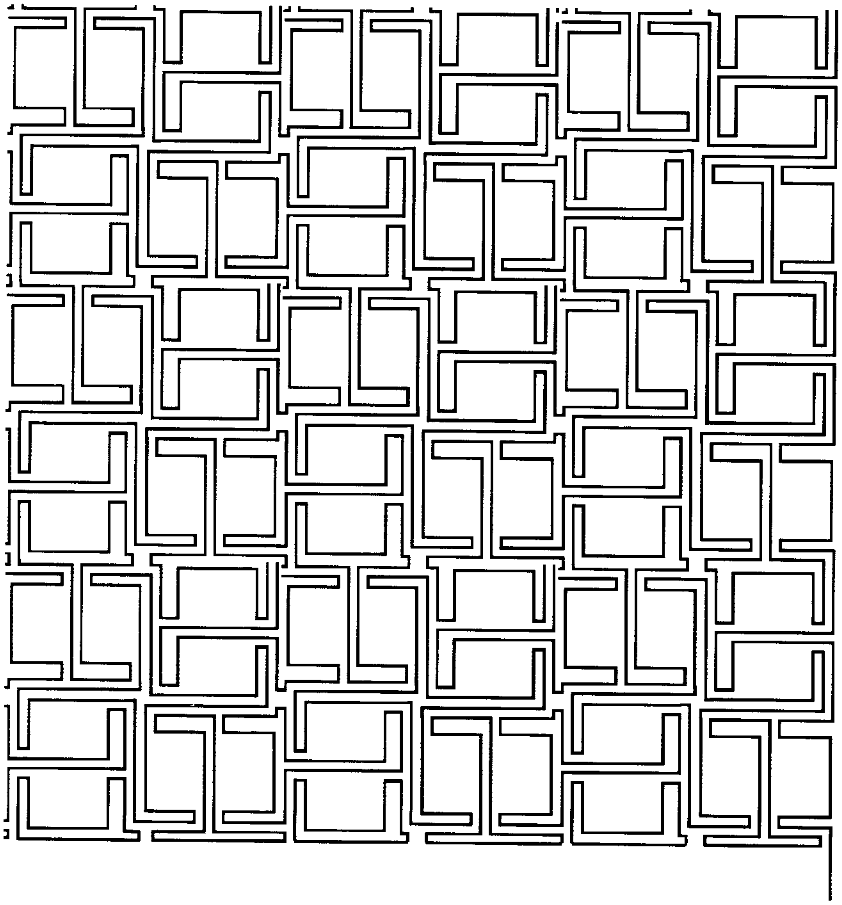
Figure 37:
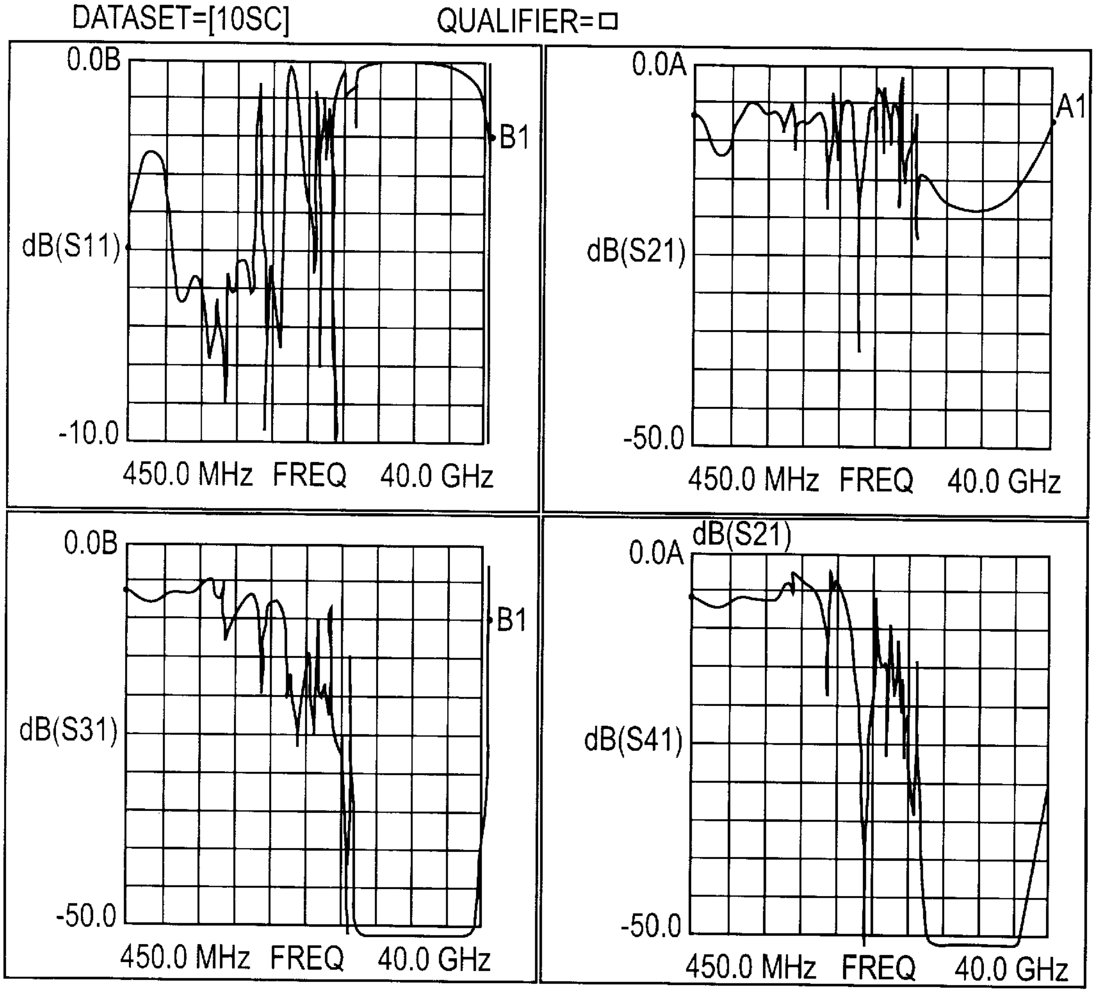
FIG. 37 shows electrical characteristics of the circuit shown in FIG. 36.
Figure 38:
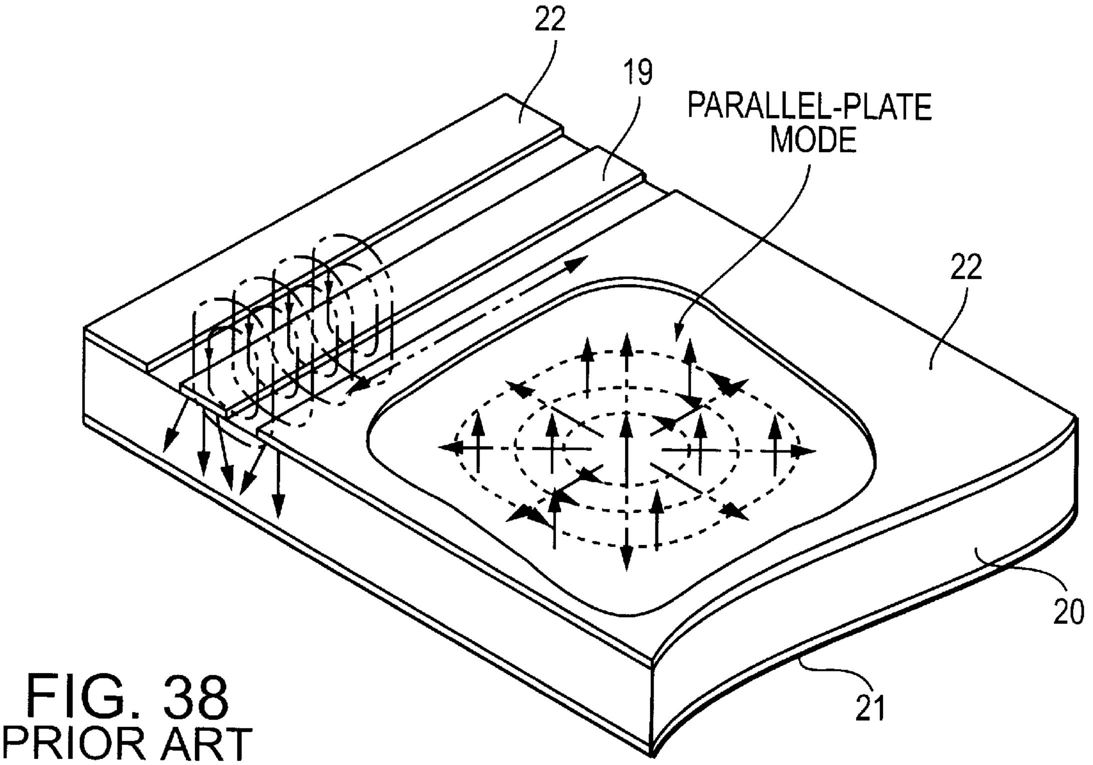
FIG. 38 PRIOR ART
FIG. 38 is a perspective view of a parallel-plate mode wave in a grounded coplanar line with a portion broken away.

Another pattern for a spurious mode propagation blocking circuit is now discussed, referring to FIG. 36A through FIG. 37.

FIG. 36A shows a unit of conductor pattern, which is further divided into four sub-units of conductor pattern. One sub-unit pattern is composed of a two-terminal pair network (i.e., a four-terminal network) including a low-impedance line, a high-impedance line and a low-impedance line connected in that order. Both low-impedance lines are arranged in a close vicinity to increase the degree of coupling therebetween. Let $\lambda g$ represent the transmission wavelength, and the low-impedance line has a length of $\lambda g/4$, and prevents the spurious mode from traveling at a certain frequency.

FIG. 37 shows characteristic diagrams of the spurious mode propagation blocking circuits constructed of the above conductor patterns. As seen from the S11 characteristic diagram, the reflection coefficient increases with frequency above a predetermined value, and the propagation of the spurious mode is effectively blocked.

In accordance with the present invention, the spurious mode propagation blocking circuit couples with the spurious mode wave traveling between the two parallel planar conductors, thereby blocking the propagation of the spurious mode wave. Since the spurious mode propagation blocking circuit is formed in the parallel planar conductors, the spurious mode propagation blocking circuit is created simply by patterning the electrode. Any problems, such as the ones associated with the conventional through hole, are not presented.

When the spurious modes are reflected in multiple directions, the spurious mode propagation blocking circuit couples with them not only in a direction perpendicular to the direction of propagation of the spurious mode but also in a direction parallel to or slanted with respect to the direction of propagation of the spurious mode.

The micro-strip mode wave, into which the spurious mode is converted, is sufficiently reflected even when is used a low-dielectric-constant dielectric plate, the impedance of which does not change greatly with the line width of the strip line varying, or is used a thick dielectric plate. A sufficient spurious mode propagation blocking effect is thus achieved.

The spurious mode propagation blocking circuit prevents interference of leaky waves between one transmission line and another transmission and between the transmission line and the resonator.

The spurious mode propagation blocking circuit prevents interference of leaky waves between the resonator and another transmission line, and between one resonator and another resonator.

Even if the layout pitch of the transmission line and the resonator is narrowed in a transmission section of a signal or in a signal processing section, such as a filter, for passing or blocking a signal in a predetermined frequency band, interference between the transmission lines or between the transmission line and the resonator is reliably prevented. A generally compact communication apparatus is thus provided.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-frequency circuit device, comprising:

at least two planar conductors disposed with respect to one another such that they are capable of receiving an electromagnetic wave therebetween; and a spurious mode propagation blocking circuit disposed in at least one of the at least two planar conductors, the spurious mode propagation blocking circuit including a conductor pattern operable to couple with a spurious mode wave, resulting from the electromagnetic wave, that propagates between the two planar conductors such that propagation of the spurious mode wave is blocked;

wherein the conductor pattern of the spurious mode propagation blocking circuit comprises a plurality of micro-strip lines spaced apart at a pitch which is shorter than the wavelength of the electromagnetic wave, and wherein at least two adjacent micro-strip lines are spaced apart and shaped such that they are sequentially separated by first and second distances to produce sequentially coupled first and second impedances.

2. A high-frequency circuit device according to claim 1, wherein the at least two adjacent micro-strip lines extend over a length while separated by the first distance and extend by substantially the same length while separated by the second distance, wherein the length is substantially equal to one quarter wavelength of a frequency to be reflected.

3. A high-frequency circuit device according to claim 1, wherein the first and second distances are such that serial high-impedance sections and low-impedance sections are obtained.

4. A high-frequency circuit device according to claim 3, wherein the micro-strip lines extend in a direction perpendicular to the direction of propagation of the electromagnetic wave traveling along a transmission line.

5. A high-frequency circuit device, comprising:

at least two planar conductors disposed with respect to one another such that they are capable of receiving an electromagnetic wave therebetween; and a spurious mode propagation blocking circuit disposed in at least one of the at least two planar conductors, the spurious mode propagation blocking circuit including a conductor pattern operable to couple with a spurious mode wave, resulting from the electromagnetic wave, that propagates between the two planar conductors such that propagation of the spurious mode wave is blocked, further comprising a dielectric plate, the planar conductors being disposed on opposite surfaces of the dielectric plate.

6. A high-frequency circuit device according to claim 5, further comprising a strip conductor formed on one of the surfaces of the dielectric plate forming a grounded coplanar line, the spurious mode propagation blocking circuit including a plurality of micro-strip lines disposed in the planar conductor on the opposite surface of the dielectric plate.

7. A high-frequency circuit device according to claim 6, wherein:

the plurality of micro-strip lines are spaced apart at a pitch which is shorter than the wavelength of the electromagnetic wave;

adjacent micro-strip lines are spaced apart and shaped such that they are sequentially separated by first and second distances to produce sequentially coupled first and second impedances;

adjacent micro-strip lines extend over a length while separated by the first distance and extend by substantially the same length while separated by the second distance, wherein the length is substantially equal to one quarter wavelength of a frequency to be reflected; and the first and second distances are such that serial high-impedance sections and low-impedance sections are obtained.

8. A high-frequency circuit device according to claim 7, wherein the micro-strip lines extend in a direction perpendicular to the grounded coplanar line.

9. A high-frequency circuit device according to claim 8, wherein the spurious mode propagation blocking circuit comprises first and second sets of micro-strip lines, the first set being disposed to one lateral side of the grounded coplanar line and the second set being disposed to an opposite lateral side of the grounded coplanar line.

10. A high-frequency circuit device according to claim 5, further comprising a slot formed on one of the surfaces of the dielectric plate forming a grounded slot line, the spurious mode propagation blocking circuit including a plurality of micro-strip lines disposed in one of the planar conductors on the dielectric plate.

11. A high-frequency circuit device according to claim 10, wherein:

the conductor pattern of the spurious mode propagation blocking circuit comprises a plurality of micro-strip lines spaced apart at a pitch which is shorter than the wavelength of the electromagnetic wave;

adjacent micro-strip lines are spaced apart and shaped such that they are sequentially separated by first and second distances to produce sequentially coupled first and second impedances;

adjacent micro-strip lines extend over a length while separated by the first distance and extend by substantially the same length while separated by the second distance, wherein the length is substantially equal to one quarter wavelength of a frequency to be reflected; and the first and second distances are such that serial high-impedance sections and low-impedance sections are obtained.

12. A high-frequency circuit device according to claim 11, wherein the micro-strip lines extend in a direction perpendicular to the grounded slot line.

13. A high-frequency circuit device according to claim 12, wherein the spurious mode propagation blocking circuit comprises first and second sets of micro-strip lines, the first set being disposed to one lateral side of the grounded slot line and the second set being disposed to an opposite lateral side of the grounded slot line.

14. A high-frequency circuit device according to claim 13, wherein the first and second sets of micro-strip lines are disposed in the planar conductor on the opposite surface of the dielectric plate as the grounded slot line.

15. A high-frequency circuit device according to claim 13, wherein the first and second sets of micro-strip lines are disposed in the planar conductor on the same surface of the dielectric plate as the grounded slot line.

16. A high-frequency circuit device according to claim 15, wherein the dielectric plate is disposed between first and second spaced apart conductive plates.

17. A high-frequency circuit device according to claim 5, further comprising:

a first dielectric strip formed on and extending along one of the surfaces of the dielectric plate;

a second dielectric strip formed on and extending along the opposite surface of the dielectric plate substantially parallel to the first dielectric strip; and first and second spaced apart conductive plates, the dielectric plate being disposed therebetween, wherein the spurious mode propagation blocking circuit includes a plurality of micro-strip lines disposed in one of the planar conductors on one of the surfaces of the dielectric plate.

18. A high-frequency circuit device according to claim 17, wherein:

the conductor pattern of the spurious mode propagation blocking circuit comprises a plurality of micro-strip lines spaced apart at a pitch which is shorter than the wavelength of the electromagnetic wave;

adjacent micro-strip lines are spaced apart and shaped such that they are sequentially separated by first and second distances to produce sequentially coupled first and second impedances;

adjacent micro-strip lines extend over a length while separated by the first distance and extend by substantially the same length while separated by the second distance, wherein the length is substantially equal to one quarter wavelength of a frequency to be reflected; and the first and second distances are such that serial high-impedance sections and low-impedance sections are obtained.

19. A high-frequency circuit device according to claim 18, wherein the micro-strip lines extend in a direction perpendicular to the first and second dielectric strips.

20. A high-frequency circuit device according to claim 19, wherein the spurious mode propagation blocking circuit comprises first and second sets of micro-strip lines, the first set being disposed to one lateral side of each dielectric strip and the second set being disposed to an opposite lateral side of each dielectric strip.

21. A high-frequency circuit device, comprising:

at least two planar conductors disposed such that they are capable of receiving an electromagnetic wave therebetween; and a spurious mode propagation blocking circuit disposed in at least one of the at least two planar conductors, the spurious mode propagation blocking circuit including a conductor pattern operable to couple with a spurious mode wave, resulting from the electromagnetic wave, that propagates between the two planar conductors such that propagation of the spurious mode wave is blocked, the conductor pattern of the spurious mode propagation blocking circuit including a plurality of micro-strip lines spaced apart at a pitch which is shorter than the wavelength of the electromagnetic wave, adjacent micro-strip lines being interdigitally disposed and extending in directions transverse to the direction of propagation of the electromagnetic wave, and each micro-strip line including a terminal end which is open circuited.

22. A high-frequency circuit device according to claim 21, wherein adjacent micro-strip lines extend in directions perpendicular to the direction of propagation of the electromagnetic wave.

23. A high-frequency circuit device, comprising:

a dielectric plate having spaced apart opposing surfaces;

first and second conductors, one conductor being disposed on each opposing surface of the dielectric plate such that they are capable of receiving an electromagnetic wave therebetween;

a substantially circular non-conductive portion located in the first conductor to produce a resonator; and a spurious mode propagation blocking circuit disposed in the first conductor and including a conductor pattern operable to couple with a spurious mode wave, resulting from the electromagnetic wave, that propagates between the two planar conductors such that propagation of the spurious mode wave is blocked, the conductor pattern of the spurious mode propagation blocking circuit including a plurality of micro-strip lines spaced apart at a pitch which is shorter than the wavelength of the electromagnetic wave.

24. A high-frequency circuit device according to claim 23, wherein:

adjacent micro-strip lines are spaced apart and shaped such that they are sequentially separated by first and second distances to produce sequentially coupled first and second impedances;

adjacent micro-strip lines extend over a length while separated by the first distance and extend by substantially the same length while separated by the second distance, wherein the length is substantially equal to one quarter wavelength of a frequency to be reflected; and the first and second distances are such that serial high-impedance sections and low-impedance sections are obtained.

25. A high-frequency circuit device according to claim 24, wherein the micro-strip lines extend in a radial direction with respect to the non-conductive portion of the resonator.

26. A high-frequency circuit device according to claim 23, wherein adjacent micro-strip lines are interdigitally disposed, extend in directions transverse to the direction of propagation of the electromagnetic wave, and each micro-strip line includes a terminal end which is open circuited.

27. A high-frequency circuit device according to claim 26, wherein the micro-strip lines extend in a radial direction with respect to the non-conductive portion of the resonator.

28. A high-frequency circuit device according to claim 23, wherein the dielectric plate is disposed between first and second spaced apart conductive plates.

29. A high-frequency circuit device, comprising:

a dielectric plate having spaced apart opposing surfaces;

first and second conductors, one conductor disposed on each opposing surface of the dielectric plate such that they are capable of receiving an electromagnetic wave therebetween;

a spurious mode propagation blocking circuit disposed in the first conductor, the spurious mode propagation blocking circuit including a conductor pattern operable to couple with a spurious mode wave, resulting from the electromagnetic wave, that propagates between the two planar conductors such that propagation of the spurious mode wave is blocked, the conductor pattern of the spurious mode propagation blocking circuit comprising plurality of micro-strip lines spaced apart at a pitch which is shorter than the wavelength of the electromagnetic wave, each micro-strip line in the conductor pattern including (i) a central conductive portion forming a capacitor with the second conductor on the opposite surface of the dielectric block, the central portion having a peripheral edge; and (ii) a plurality of conductive lines extending from the peripheral edge of the central conductive portion to form respective inductances, sets of conductive lines from adjacent micro-strip lines being connected together.

30. A high-frequency circuit device according to claim 29, wherein each central conductive portion in the conductor pattern includes three conductive lines extending from each peripheral edge.

31. A high-frequency circuit device according to claim 30, wherein each central conductive portion in the conductor pattern is substantially triangular and circumscribed by three peripheral edge segments, one conductive line extending from each peripheral edge segment.

32. A high-frequency circuit device according to claim 29, wherein each central conductive portion in the conductor pattern includes four conductive lines extending from each peripheral edge.

33. A high-frequency circuit device according to claim 32, wherein each central conductive portion in the conductor pattern is substantially rectangular and circumscribed by four peripheral edge segments, one conductive line extending from each peripheral edge segment.

34. A high-frequency circuit device according to claim 33, wherein each conductive line extends from its respective peripheral edge segment from a position which substantially bisects that edge segment.

35. A high-frequency circuit device according to claim 33, wherein each conductive line extends from its respective peripheral edge segment from a position which substantially offset toward one end of that edge segment.

36. A high-frequency circuit device according to claim 29, wherein each micro-strip line in the conductor pattern includes a plurality of distal conductive portions, one distal conductive portion at a distal end of each conductive line to form a capacitor with the second conductor on the opposite surface of the dielectric plate.

37. A high-frequency circuit device according to claim 36, wherein sets of adjacent distal conductive portions are connected together to form a single capacitor with the second conductor on the opposite surface of the dielectric plate.

* * * * *